(12) United States Patent
Nijhawan et al.

(10) Patent No.: US 8,183,132 B2
(45) Date of Patent: May 22, 2012

(54) METHODS FOR FABRICATING GROUP III NITRIDE STRUCTURES WITH A CLUSTER TOOL

(75) Inventors: Sandeep Nijhawan, Los Altos, CA (US); Brian H. Burrows, San Jose, CA (US); Tetsuya Ishikawa, Saratoga, CA (US); Olga Kryliouk, Sunnyvale, CA (US); Anand Vasudev, San Francisco, CA (US); Jie Su, Santa Clara, CA (US); David H. Quach, San Jose, CA (US); Anzhong Chang, San Jose, CA (US); Yuriy Melnik, Santa Clara, CA (US); Harsukhdeep S. Ratia, Santa Clara, CA (US); Son T. Nguyen, San Jose, CA (US); Lily Pang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 13 days.

(21) Appl. No.: 12/751,692

(22) Filed: Mar. 31, 2010

(65) Prior Publication Data

US 2010/0261340 A1    Oct. 14, 2010

Related U.S. Application Data

(60) Provisional application No. 61/177,098, filed on May 11, 2009, provisional application No. 61/230,877, filed on Aug. 3, 2009, provisional application No. 61/173,536, filed on Apr. 28, 2009, provisional application No. 61/168,399, filed on Apr. 10, 2009, provisional application No. 61/172,630, filed on Apr. 24, 2009.

(51) Int. Cl.
*H01L 21/20* (2006.01)
*H01L 21/00* (2006.01)

(52) U.S. Cl. ............ 438/478; 438/503; 438/507; 438/46

(58) Field of Classification Search ................. None
See application file for complete search history.

(56) References Cited

U.S. PATENT DOCUMENTS

| 3,063,867 | A | 11/1962 | Emery, Jr |
| 4,851,295 | A | 7/1989 | Brors |
| D329,839 | S | 9/1992 | Ehrhart |

(Continued)

FOREIGN PATENT DOCUMENTS

CN         1423834        6/2003

(Continued)

OTHER PUBLICATIONS

Office Action, U.S. Appl. No. 11/925,615 dated Nov. 19, 2010.

(Continued)

*Primary Examiner* — Scott B Geyer
(74) *Attorney, Agent, or Firm* — Patterson & Sheridan, LLP

(57) ABSTRACT

The present invention generally provides apparatus and methods for forming LED structures. One embodiment of the present invention provides a method for fabricating a compound nitride structure comprising forming a first layer comprising a first group-III element and nitrogen on substrates in a first processing chamber by a hydride vapor phase epitaxial (HVPE) process or a metal organic chemical vapor deposition (MOCVD) process, forming a second layer comprising a second group-III element and nitrogen over the first layer in a second processing chamber by a MOCVD process, and forming a third layer comprising a third group-III element and nitrogen over the second layer by a MOCVD process.

23 Claims, 10 Drawing Sheets

U.S. PATENT DOCUMENTS

| | | | |
|---|---|---|---|
| 5,273,588 | A | 12/1993 | Foster et al. |
| 5,348,911 | A | 9/1994 | Jurgensen et al. |
| 5,359,788 | A | 11/1994 | Gell, Jr. |
| 5,636,320 | A | 6/1997 | Yu et al. |
| 5,647,911 | A | 7/1997 | Vanell et al. |
| 5,667,592 | A | 9/1997 | Boitnott et al. |
| 5,715,361 | A | 2/1998 | Moslehi |
| 5,762,755 | A | 6/1998 | McNeilly et al. |
| 5,814,239 | A | 9/1998 | Kaneko et al. |
| 5,855,675 | A | 1/1999 | Doering et al. |
| 5,858,471 | A | 1/1999 | Ray et al. |
| 5,871,586 | A | 2/1999 | Crawley et al. |
| 6,086,673 | A | 7/2000 | Molnar |
| 6,156,581 | A | 12/2000 | Vaudo et al. |
| 6,200,893 | B1 | 3/2001 | Sneh |
| 6,206,972 | B1 | 3/2001 | Dunham |
| 6,218,280 | B1 | 4/2001 | Kryliouk et al. |
| 6,270,569 | B1 | 8/2001 | Shibata et al. |
| 6,274,495 | B1 | 8/2001 | Omstead et al. |
| 6,286,451 | B1 | 9/2001 | Ishikawa et al. |
| 6,305,314 | B1 | 10/2001 | Sneh et al. |
| 6,309,465 | B1 | 10/2001 | Jurgensen et al. |
| 6,350,666 | B2 | 2/2002 | Kryliouk |
| 6,451,119 | B2 | 9/2002 | Sneh et al. |
| 6,451,695 | B2 | 9/2002 | Sneh |
| 6,451,713 | B1 | 9/2002 | Tay et al. |
| 6,464,843 | B1 | 10/2002 | Wicker et al. |
| 6,475,910 | B1 | 11/2002 | Sneh |
| 6,503,330 | B1 | 1/2003 | Sneh et al. |
| 6,508,197 | B1 | 1/2003 | Omstead et al. |
| 6,517,634 | B2 | 2/2003 | Pang et al. |
| 6,528,394 | B1 | 3/2003 | Lee |
| 6,540,838 | B2 | 4/2003 | Sneh et al. |
| 6,551,399 | B1 | 4/2003 | Sneh et al. |
| 6,562,720 | B2 | 5/2003 | Thilderkvist et al. |
| 6,562,730 | B2 | 5/2003 | Jeng et al. |
| 6,569,765 | B1 | 5/2003 | Solomon et al. |
| 6,602,784 | B2 | 8/2003 | Sneh |
| 6,616,766 | B2 | 9/2003 | Dunham |
| 6,616,870 | B1 | 9/2003 | Goela et al. |
| 6,630,401 | B2 | 10/2003 | Sneh |
| 6,638,859 | B2 | 10/2003 | Sneh et al. |
| 6,638,862 | B2 | 10/2003 | Sneh |
| 6,660,083 | B2 | 12/2003 | Tsvetkov et al. |
| 6,733,591 | B2 | 5/2004 | Anderson |
| 6,849,241 | B2 | 2/2005 | Dauelsberg et al. |
| 6,897,119 | B1 | 5/2005 | Sneh et al. |
| 6,902,990 | B2 | 6/2005 | Gottfried et al. |
| 6,905,547 | B1 | 6/2005 | Londergan et al. |
| 6,921,437 | B1 | 7/2005 | DeDontney et al. |
| 6,927,426 | B2 | 8/2005 | Matsuoka et al. |
| 6,962,624 | B2 | 11/2005 | Jurgensen et al. |
| 6,964,876 | B2 | 11/2005 | Heuken |
| 6,972,050 | B2 | 12/2005 | Bremser et al. |
| 6,983,620 | B2 | 1/2006 | Kaeppeler |
| 7,018,940 | B2 | 3/2006 | Dunham |
| 7,033,921 | B2 | 4/2006 | Jurgensen |
| 7,078,318 | B2 | 7/2006 | Jurgensen et al. |
| 7,115,896 | B2 | 10/2006 | Guo et al. |
| 7,128,785 | B2 | 10/2006 | Kaeppeler et al. |
| 7,147,718 | B2 | 12/2006 | Jurgensen et al. |
| 7,364,991 | B2 | 4/2008 | Bour et al. |
| 7,368,368 | B2 | 5/2008 | Emerson |
| 7,625,448 | B2 | 12/2009 | Dauelsberg et al. |
| 7,682,940 | B2 | 3/2010 | Ye et al. |
| 7,762,208 | B2 | 7/2010 | Juergensen et al. |
| 2001/0050059 | A1 | 12/2001 | Hongo et al. |
| 2002/0164423 | A1 | 11/2002 | Chiang et al. |
| 2004/0221809 | A1 | 11/2004 | Ohmi et al. |
| 2006/0021568 | A1 | 2/2006 | Matsumoto |
| 2006/0154455 | A1 | 7/2006 | Guo et al. |
| 2006/0162661 | A1 | 7/2006 | Jung et al. |
| 2006/0205199 | A1 | 9/2006 | Baker et al. |
| 2007/0010033 | A1 | 1/2007 | Aderhold et al. |
| 2007/0259464 | A1* | 11/2007 | Bour et al. .................. 438/22 |
| 2007/0259502 | A1 | 11/2007 | Bour et al. |
| 2008/0050889 | A1 | 2/2008 | Bour et al. |
| 2008/0206464 | A1 | 8/2008 | Kappeler |
| 2009/0149008 | A1 | 6/2009 | Kryliouk et al. |
| 2009/0194026 | A1 | 8/2009 | Burrows et al. |
| 2010/0273291 | A1* | 10/2010 | Kryliouk et al. .............. 438/99 |
| 2011/0155049 | A1* | 6/2011 | Solomon et al. .............. 117/99 |

FOREIGN PATENT DOCUMENTS

| | | | |
|---|---|---|---|
| JP | 2004-140328 A | | 5/2004 |
| JP | 2007-039272 A | | 2/2007 |
| JP | 2007-154297 A | | 6/2007 |
| JP | D1304483 | | 6/2007 |
| JP | 2008-066490 A | | 3/2008 |
| JP | D1361441 | | 6/2009 |
| KR | 10-0578089 B1 | | 5/2006 |
| TW | 555877 B | | 10/2003 |
| WO | WO-2009099721 A2 | | 8/2009 |

OTHER PUBLICATIONS

Motoki, et al. "Preparation of Large Freestanding GaN Substrates by Hydride Vapor Phase Epitaxy Using GaAs as a Starting Substrate", JP Appl. Phys. vol. 40 (2001) pp. L140-L143. Part 2. No. 2B. Feb. 15, 2001.

Kikuchi, et al. "Thermodynamic Analysis of Various Types of Hydride Vapor Phase Epitaxy System for High-Speed Growth of InN", 2006, Japanese Journal of Appiled Physics, vol. 45 No. 45, pp. L1203-L1205.

Kelly, et al. "Large Free-Standing GaN Substrates by Hydride Vapor Phase Epitaxy and Laser-Induced Liftoff", JP Appl. Phys. vol. 38 (1999) pp. L217-L219. Part 2. No, 3A. Mar. 1, 1999.

Park, et al. "Free-Standing GaN Substrates by Hydride Vapor Phase Epitaxy", JP Appl. Phys. vol. 39 (2000) pp. L1141-L1142. Part 2. No. 11B. Nov. 15, 2000.

Ban, Vladimir S. "Mass Spectrometric Studies of Vapor-Phase Crystal Growth", vol. 119, Issue 6. pp. 761-765. Jun. 1972.

Office Action, U.S. Appl. No. 11/767,520 dated Sep. 8, 2010.

Chinese Office Action for Application No. 200810168234.1 dated Aug. 16, 2010.

International Search Report, PCT/US2010/032313 dated Dec. 6, 2010.

Bohnen, et al, "Enhanced Growth Rates and Reduced Parasitic Deposition by the Substitution of $Cl_2$ for HC1l in GaN HVPE", Journal of Crystal Growth 312 (2010) 2542-2550.

Office action for Taiwan patent application No. 099301936 dated Sep. 27, 2010.

International Search Report and Written Opinion of the International Searching Authority mailed Nov. 26, 2010 in PCT/US2010/032032.

International search report and written opinion for PCT/US2010/030492 dated Oct. 27, 2010.

International search report and written opinion for PCT/US2010/030496 dated Oct. 27, 2010.

International search report and written opinion for PCT/US2010/032597 dated Dec. 1, 2010.

* cited by examiner

METHODS FOR FABRICATING GROUP III NITRIDE STRUCTURES WITH A CLUSTER TOOL

CROSS-REFERENCE TO RELATED APPLICATIONS

This application claims priority to U.S. Provisional Patent Application Ser. No. 61/177,098, filed on May 11, 2009, U.S. Provisional Patent Application Ser. No. 61/230,877, filed on Aug. 3, 2009, U.S. Provisional Patent Application Ser. No. 61/173,536, filed on Apr. 28, 2009, U.S. Provisional Patent Application Ser. No. 61/168,399, filed on Apr. 10, 2009, and U.S. Provisional Patent Application Ser. No. 61/172,630, filed on Apr. 24, 2009. The aforementioned applications 61/177,098, 61/230,877, 61/173,536, and 61/168,399 are incorporated herein by reference.

BACKGROUND OF THE INVENTION

1. Field of the Invention

Embodiments of the present invention generally relate to the manufacture of semiconductor devices. More particularly, embodiments of the present invention relate to apparatus and method for manufacturing nitride compound semiconductor device, such as light emitting diodes (LEDs) and laser diodes (LDs).

2. Description of the Related Art

The history of light-emitting diodes ("LEDs") is sometimes characterized as a "crawl up the spectrum." This is because the first commercial LEDs produced light in the infrared portion of the spectrum, followed by the development of red LEDs that used GaAsP on a GaAs substrate. This was, in turn, followed by the use of GaP LEDs with improved efficiency that permitted the production of both brighter red LEDs and orange LEDs. Refinements in the use of GaP then permitted the development of green LEDs, with dual GaP chips (one in red and one in green) permitting the generation of yellow light. Further improvements in efficiency in this portion of the spectrum were later enabled through the use of GaAlAsP and InGaAlP materials.

This evolution towards the production of LEDs that provide light at progressively shorter wavelengths has generally been desirable not only for its ability to provide broad spectral coverage but because diode production of short-wavelength light may improve the information storage capacity of optical devices like CD-ROMs. The production of LEDs in the blue, violet, and ultraviolet portions of the spectrum was largely enabled by the development of nitride-based LEDs, particularly through the use of GaN. While some modestly successful efforts had previously been made in the production of blue LEDs using SiC materials, such devices suffered from poor luminescence as a consequence of the fact that their electronic structure has an indirect bandgap.

While the feasibility of using GaN to create photoluminescence in the blue region of the spectrum has been known for decades, there were numerous barriers that impeded their practical fabrication. These barriers included the lack of a suitable substrate on which to grow the GaN structures, generally high thermal requirements for growing GaN that resulted in various thermal-convection problems and a variety of difficulties in efficient p-doping of such materials. The use of sapphire as a substrate was not completely satisfactory because it provides approximately a 15% lattice mismatch with the GaN. Progress has subsequently been made in addressing many aspects of these barriers. For example, the use of a buffer layer of AlN or GaN formed from a metal-organic vapor has been found effective in accommodating the lattice mismatch. Further refinements in the production of Ga—N-based structures has included the use of AlGaN materials to form heterojunctions with GaN and particularly the use of InGaN, which causes the creation of defects that act as quantum wells to emit light efficiently at short wavelengths. Indium-rich regions have a smaller bandgap than surrounding material, and may be distributed throughout the material to provide efficient emission centers.

While some improvements have thus been made in the manufacture of such compound nitride semiconductor devices, it is widely recognized that a number of deficiencies yet exist in current manufacturing processes. Moreover, the high utility of devices that generate light at such wavelengths has caused the production of such devices to be an area of intense interest and activity.

In view of these considerations, there is a general need in the art for improved methods and systems for fabricating compound nitride semiconductor devices.

SUMMARY OF THE INVENTION

The present invention generally provides apparatus and methods for forming LED structures, LD structures, and electronic devices including high power, high frequency, high temperature transistors and integrated circuits.

One embodiment of the present invention provides a method for fabricating a compound nitride structure comprising transferring one or more substrates to a first processing chamber, forming a n-doped Gallium Nitride (GaN) layer on the one or more substrates in the first processing chamber by a hydride vapor phase epitaxial (HVPE) process or a metal organic chemical vapor deposition (MOCVD) process, transferring the one or more substrates to a second processing chamber, forming a InGaN multi-quantum-well active layer on the one or more substrates in the second processing chamber by a MOCVD process, transferring the one or more substrates to a third processing chamber, forming a p-doped AlGaN layer on the one or more substrates by a MOCVD process, and forming a p-doped GaN layer on the one or more substrates by a MOCVD process.

Another embodiment provides a method for fabricating a compound nitride semiconductor structure comprising positioning one or more substrates on a susceptor in a processing region of a first metal organic chemical vapor deposition (MOCVD) chamber comprising a showerhead, flowing a first gallium containing precursor and a first nitrogen containing precursor through the showerhead into the first MOCVD chamber, depositing a gallium nitride layer over the one or more substrates with a thermal chemical-vapor-deposition process within the first MOCVD chamber using the gallium containing precursor and the first nitrogen containing precursor, removing the one or more substrates from the first MOCVD chamber without exposing the one or more substrates to atmosphere, transferring the one or more substrates into a second MOCVD chamber, flowing a second gallium containing precursor, an indium containing precursor, and a second nitrogen containing precursor into the second MOCVD processing chamber, depositing an InGaN layer over the GaN layer with a thermal chemical-vapor-deposition process within the second MOCVD processing chamber using the second gallium containing precursor, the indium containing precursor, and the second nitrogen containing precursor, removing the one or more substrates from the second MOCVD chamber without exposing the one or more substrates to atmosphere, transferring the one or more substrates into a third MOCVD chamber, flowing a third gallium containing precursor, an aluminum containing precursor, and a third nitrogen containing precursor into the third MOCVD processing chamber, and depositing an AlGaN layer over the InGaN layer with a thermal chemical-vapor-deposition process within the third MOCVD processing chamber using the third gallium containing precursor, the aluminum containing precursor, and the third nitrogen containing precursor.

Yet another embodiment of the present invention provides a method for fabricating a compound nitride semiconductor structure, comprising flowing a first group-III precursor and a first nitrogen containing precursor into a first processing chamber, the first group-III precursor comprising a first group-III element, depositing a first layer over one or more substrates within the first processing chamber using the first group-III precursor and the first nitrogen containing precursor, the first layer comprising nitrogen and the first group-III element, removing the one or more substrates from the first processing chamber without exposing the one or more substrates to atmosphere, transferring the one or more substrates into a second processing chamber, flowing a second group-III precursor and a second nitrogen containing precursor into the second processing chamber, the second group-III precursor comprising a second group-III element not comprised by the first group-III precursor, depositing a second layer over the one or more substrates with a thermal chemical-vapor deposition process within the second processing chamber using the second group-III precursor and the second nitrogen containing precursor, the second layer comprising nitrogen and the second group-III element, removing the one or more substrates from the second substrate processing chamber without exposing the one or more substrates to atmosphere, transferring the one or more substrates into a third substrate processing chamber, flowing a third group-III precursor and a third nitrogen containing precursor into the third processing chamber, the third group-III precursor comprising a third group-III element not comprised by the first group-III precursor or the second group-III precursor, and depositing a third layer over the one or more substrates with a thermal chemical-vapor deposition process within the third processing chamber using the third group-III precursor and the third nitrogen containing precursor, the third layer comprising nitrogen and the third group-III element.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally provides an apparatus and method for simultaneously processing substrates using a multi-chamber processing system (e.g. a cluster tool) that has an increased system throughput, increased system reliability, and increased substrate to substrate uniformity.

In one embodiment, the processing system is adapted to fabricate compound nitride semiconductor devices in which a substrate is disposed in a HVPE chamber or a MOCVD chamber where a buffer GaN layer and n-doped GaN layer are deposited on the substrate, then the substrate is transferred to a second chamber where a multi quantum well (MQW) layer and a p-doped AlGaN layer are deposited on the n-doped GaN layer.

In another embodiment, the processing system is adapted to fabricate compound nitride semiconductor devices in which a substrate is disposed in a HVPE chamber or a MOCVD chamber where a buffer GaN layer and a n-doped GaN layer is deposited on the substrate, then the substrate is transferred to a second chamber where a MQW layer is deposited over the n-doped GaN layer, and then the substrate is transferred to a third chamber where a p-doped AlGaN layer is deposited on the MQW layer.

In another embodiment, the processing system is adapted to fabricate compound nitride semiconductor devices in which a buffer GaN layer is deposited on the substrate in a first processing chamber, the substrate is then transferred to a second chamber where a n-doped GaN layer is deposited over the buffer GaN layer, then the substrate is transferred to a third chamber where a MQW layer is deposited over the n-doped GaN layer, and then the substrate is transferred to a fourth chamber where a p-doped AlGaN layer is deposited on the MQW layer.

Figure 1A:
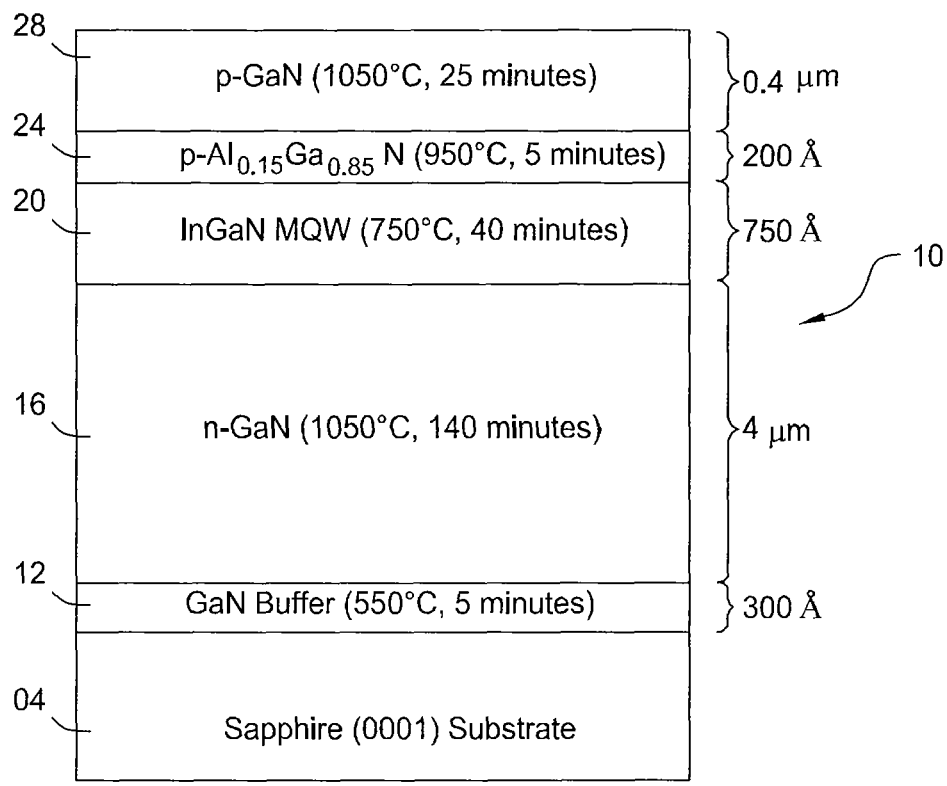
FIG. 1A is a schematic sectional side view of a GaN based LED structure.

In conventional manufacturing of compound nitride semiconductor structures, multiple epitaxial deposition steps are performed in a single process reactor, with the substrate not leaving the reactor until all of the steps have been completed. FIG. 1A is a schematic sectional side view of a gallium and nitride based LED structure 10. The LED structure 10 is fabricated over a sapphire (0001) substrate 4 after a cleaning procedure. An exemplary procedure may be performed in 10 minutes at about 1050° C. The cleaning procedure may be accompanied take additional time on the order of 10 minutes for heat-up and cool-down.

A GaN buffer layer 12 is deposited over the cleaned substrate 4. The GaN buffer layer 12 may be formed by a HVPE process or a MOCVD process. For example, the GaN buffer layer 12 may be deposited by providing flows of Gallium and Nitrogen precursors to a processing chamber and using thermal processes to achieve deposition. A typical GaN buffer layer 12 has a thickness of about 300 Å, which may be deposited at a temperature of about 550° C. for about five minutes.

An n-GaN (n-doped GaN) layer 16 is subsequently deposited on the GaN buffer layer 12. the n-GaN layer 16 may be formed by a HVPE process or a MOCVD process. In one embedment, n-GaN layer 16 may be deposited at a higher temperature, for example at about 1050° C. The n-GaN layer 16 is relatively thick, with deposition of a thickness on the order of 4 μm requiring about 140 minutes.

An InGaN multi-quantum-well (MQW) layer 20 is subsequently deposited over the n-GaN layer 16. The InGaN MQW layer 20 may have a thickness of about 750 Å and take about 40 minutes to form at about 750° C.

A p-AlGaN (p-doped AlGaN) layer 24 is deposited over the MQW layer 20. The p-AlGaN layer 24 may have a thickness of about f a 200 Å and take about five minutes at a temperature of about 950° C. to form.

A p-GaN (p-doped GaN) contact layer 28 is then deposited over the p-AlGaN layer 24. The p-GaN contact layer 28 may have a thickness of about 0.4 μm requiring about 25 minutes to form at about 1050° C.

Conventional fabrication with multiple deposition steps being performed in a single reactor in a single session results in a long processing time, usually on the order of 4-6 hours. This long processing time results in low reactor throughput. The low reactor throughput is often addressed by the use of batch processing techniques. For instance, commercial reactors used in production processes may operate simultaneously on 20-50 two-inch wafers, which results in relatively poor yield. Embodiments of the present invention further increases reactor throughput by using multiple processing chambers in the fabrication to form the multiple layers, each processing chamber is adjusted to the best perform a particular deposition. In one embodiment, each processing chamber may have hardware adjusted to a particular process. In another embodiment, processing parameters of each processing chamber, such as temperature, pressure, flow ratio, may be adjusted to accelerate a particular process.

Figure 1B:
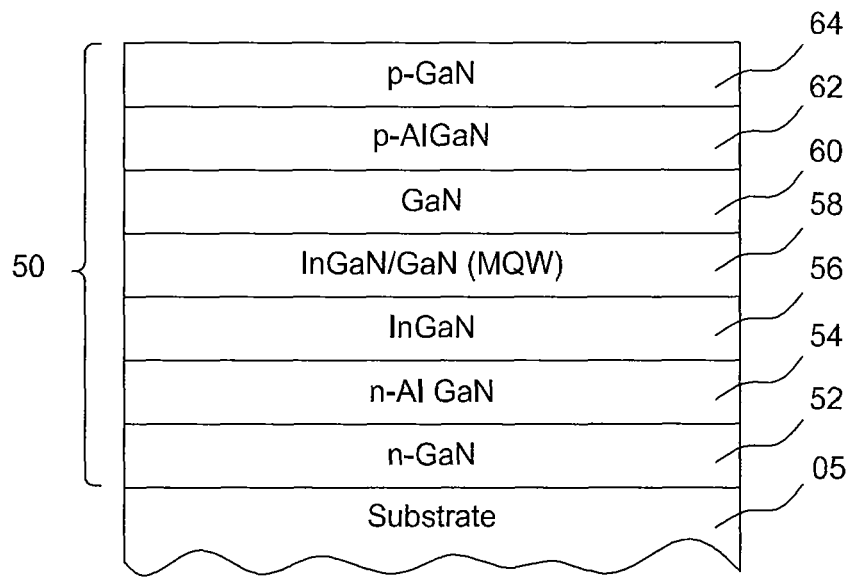
FIG. 1B is schematic illustration of a GaN based LD structure.

FIG. 1B is a schematic illustration of a GaN based LD structure 50 formed on an aluminum oxide containing substrate 5. The aluminum oxide containing substrate 5 may be similar to the aluminum oxide containing substrate 4 of FIG. 1A. The substrate 5 may be formed from solid aluminum oxide, such as sapphire (0001). The substrate 5 may also be a composite substrate having a surface containing aluminum oxide for fabricating a compound nitride structure thereon.

In one embodiment, the LD structure 50 is formed on the substrate 5 after a thermal cleaning procedure and a pretreatment process. The thermal cleaning procedure may be performed by exposing the substrate 5 to a cleaning gas mixture comprising ammonia and carrier gas while the substrate 5 is being heated. In one embodiment, the pretreatment process comprises exposing the substrate to a pretreatment gas mixture while the substrate is heated an elevated temperature range. In one embodiment, the pretreatment gas mixture is an etching agent comprising a halogen gas.

The LD structure 50 is a stack of formed on the substrate 5. The LD structure 50 starts from an n-type GaN contact layer 52. The LD structure 50 further comprises an n-type cladding layer 54. The cladding layer 54 may comprise AlGaN. An undopped guide layer 56 is formed over the cladding layer 54. The guide layer 56 may comprise InGaN. An active layer 58 having a multiquantum well (MQW) structure is formed on the guide layer 56. An undoped guide layer 60 is formed over the active layer 58. A p-type electron block layer 62 is formed over the undoped guide layer 60. A p-type contact GaN layer 64 is formed over the p-type electron block layer 62.

Figure 2A:
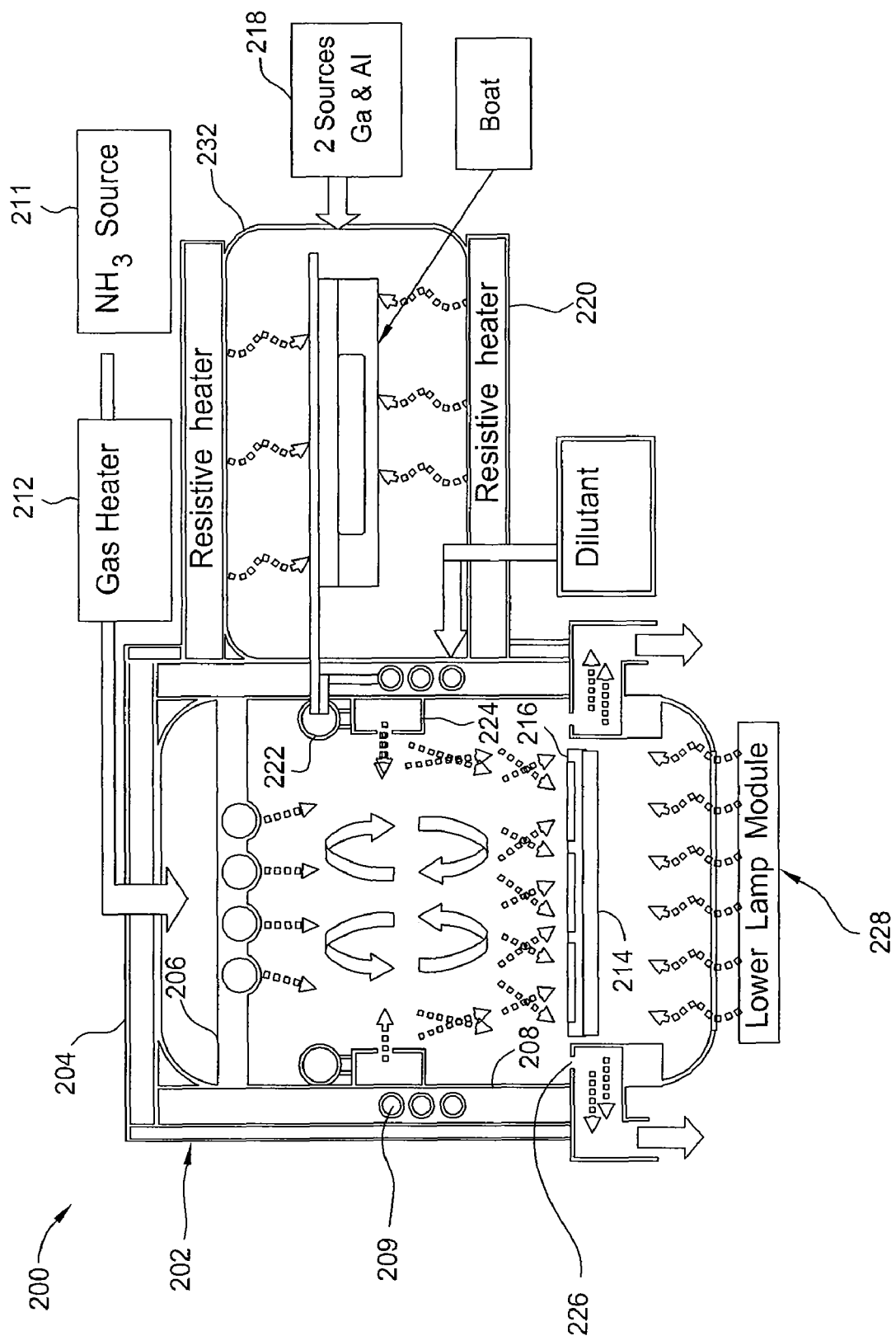
FIG. 2A is a schematic sectional side view of a HVPE chamber in according within one embodiment of the present invention.

FIG. 2A is a schematic view of an HVPE chamber 200 according to one embodiment. The apparatus includes a chamber 202 enclosed by a lid 204. Processing gas from a first gas source 211 is delivered to the chamber 202 through a gas distribution showerhead 206. In one embodiment, the first gas source 211 may comprise a nitrogen containing compound. In another embodiment, the first gas source 211 may comprise ammonia. In one embodiment, an inert gas such as helium or diatomic nitrogen may be introduced as well either through the gas distribution showerhead 206 or through the walls 208 of the chamber 202. An energy source 212 may be disposed between the first gas source 211 and the gas distribution showerhead 206. In one embodiment, the energy source 212 may comprise a heater. The energy source 212 may break up the gas from the first gas source 211, such as ammonia, so that the nitrogen from the nitrogen containing gas is more reactive.

To react with the gas from the first gas source 211, precursor material may be delivered from one or more precursor sources 218. The one or more precursor sources 218 may comprise precursors such as gallium and aluminum. It is to be understood that while reference will be made to two precursors, more or less precursors may be delivered as discussed above. In one embodiment, the precursor comprises gallium present in the precursor source 218 in liquid form. In another embodiment, the precursor comprises aluminum present in the precursor source 218 in solid form. In one embodiment, the aluminum precursor may be in solid, powder form. The precursor may be delivered to the chamber 202 by flowing a reactive gas over and/or through the precursor in the precursor source 218. In one embodiment, the reactive gas may comprise a chlorine containing gas such as diatomic chlorine. The chlorine containing gas may react with the precursor source such as gallium or aluminum to form a chloride. In one embodiment, the one or more second sources 218 may comprise eutectic materials and their alloys. In another embodiment, the HVPE apparatus 200 may be arranged to handle doped sources as well as at least one intrinsic source to control the dopant concentration.

Embodiment of the present invention increases the effectiveness of the chlorine containing gas to react with the precursor by snaking the chlorine containing gas through the boat area in the source module 232 and heating the chlorine containing gas with the resistive heater 220, thus increasing the residence time that the chlorine containing gas is snaked through the source module 232. The temperature of the chlorine containing gas can be controlled. By increasing the temperature of the chlorine containing gas, the chlorine may react with the precursor faster. In other words, the temperature is a catalyst to the reaction between the chlorine and the precursor.

In order to increase the reactiveness of the precursor, the precursor may be heated by a resistive heater 220 within the source module 232 in a boat. For example, in one embodiment, the gallium precursor may be heated to a temperature of between about 750 degrees Celsius to about 850 degrees Celsius. The chloride reaction product may then be delivered to the chamber 202. The reactive chloride product first enters a tube 222 where it evenly distributes within the tube 222. The tube 222 is connected to another tube 224. The chloride reaction product enters the second tube 224 after it has been evenly distributed within the first tube 222. The chloride reaction product then enters into the chamber 202 where it mixes with the nitrogen containing gas to form a nitride layer on the substrate 216 that is disposed on a susceptor 214. In one embodiment, the susceptor 214 may comprise silicon carbide. The nitride layer may comprise gallium nitride or aluminum nitride for example. The other reaction product, such as nitrogen and chlorine, is exhausted through an exhaust 226.

Traditionally, during HVPE, a chorine containing gas (e.g. HCl) is first reacted with a metal precursor (thrmethylgallium) in a source zone of a hot wall reactor to form a metal chloride, and the metal chloride is then combined with a nitrogen source in a downstream reaction zone of the hot wall reactor. Comparing to the traditional HVPE chamber design, the HVPE chamber 200 increases the effectiveness of chlorine containing gas by increasing the residence time of the chlorine gas to control temperature of the chlorine containing gas. The HVPE chamber 200 also has increased efficiency because the chloride generation is speed up by increased temperature of chlorine containing gas.

The chamber 202 may have a thermal gradient that can lead to a buoyancy effect. For example, the nitrogen based gas is introduced through the gas distribution showerhead 206 at a temperature between about 450 degrees Celsius and about 550 degrees Celsius. The chamber walls 208 may have a temperature of about 600 degrees Celsius to about 700 degrees Celsius. The susceptor 214 may have a temperature of about 1050 to about 1150 degrees Celsius. Thus, the temperature difference within the chamber 202 may permit the gas to rise within the chamber 202 as it is heated and then fall as it cools. The raising and falling of the gas may cause the nitrogen gas and the chloride gas to mix. Additionally, the buoyancy effect will reduce the amount of gallium nitride or aluminum nitride that deposits on the walls 208 because of the mixing.

The heating of the processing chamber 202 is accomplished by heating the susceptor 214 with a lamp module 228 that is disposed below the susceptor 214. During deposition, the lamp module 228 is the main source of heat for the processing chamber 202. While shown and described as a lamp module 228, it is to be understood that other heating sources may be used. Additional heating of the processing chamber 202 may be accomplished by use of a heater 209 embedded within the walls 208 of the chamber 202. The heater 209 embedded in the walls 208 may provide little if any heat during the deposition process. A thermocouple may be used to measure the temperature inside the processing chamber. Output from the thermocouple may be fed back to a controller that controls the heating of the heater 209 based upon the reading from the thermocouple. For example, if the chamber is too cool, the heater 209 will be turned on. If the chamber is too hot, the heater 209 will be turned off. Additionally, the amount of heating from the heater 209 may be controlled such that a low amount of heat is provided from the heater 209.

After the deposition process, the substrate 216 is normally taken out of the processing chamber 202. The lamp module 228 is turned off. Without the heat from the lamp module 228, the chamber 202 may rapidly cool. The gallium nitride or aluminum nitride that may have deposited on the walls 208 may have a different coefficient of thermal expansion than the walls 208 themselves. Thus, the gallium nitride or the aluminum nitride may flake off due to thermal expansion. To prevent undesired flaking, the heater 209 embedded within the chamber walls 208 may be turned on to control the thermal expansion and maintain the chamber 202 at the desired chamber temperature. The control of the heater 209 may again be based upon real time feedback from the thermocouple. Once the lamp module 228 is turned off, the heater 209 may be turned on or up to maintain the temperature of the chamber 202 at the desired temperature so that gallium nitride or aluminum nitride may not flake off and contaminate the substrate or land on the susceptor 214 and create an uneven susceptor 214 surface. By maintaining the chamber walls 208 at an elevated temperature, the chlorine will be more effective in cleaning the depositions from the chamber walls 208.

In general, a deposition process will proceed as follows. A substrate 216 may initially be inserted into the processing chamber 202 and disposed on the susceptor 214. In one embodiment, the substrate 216 may comprise sapphire. The lamp module 228 may be turned on to heat the substrate 216 and correspondingly the chamber 202. Nitrogen containing reactive gas may be introduced from a first gas source 211 to the processing chamber. The nitrogen containing gas may pass through an energy source 212 such as a gas heater to bring the nitrogen containing gas into a more reactive state. The nitrogen containing gas then passes through the chamber lid 204 and the gas distribution showerhead 206. In one embodiment, the chamber lid 204 may be water cooled.

A precursor may also be delivered to the chamber 202. A chlorine containing gas may pass through and/or over the precursor in a precursor source 218. The chlorine containing gas then reacts with the precursor to form a chloride. The chloride his heated with a resistive heater 220 in the source module 232 and then delivered into an upper tube 222 where it evenly distributes within the tube 222. The chloride gas then flows down into the other tube 224 before it is introduced into the interior of the chamber 202. It is to be understood that while chlorine containing gas has been discussed, the invention is not to be limited to chlorine containing gas. Rather, other compounds may be used in the HVPE process. The chamber walls 208 may have a minimal amount of heat generated from the heater 209 embedded within the walls 208. The majority of the heat within the chamber 202 is generated by the lamp module 228 below the susceptor 214.

Due to the thermal gradient within the chamber 202, the chloride gas and the nitrogen containing gas rise and fall within the processing chamber 202 and thus intermix to form a nitride compound that is deposited on the substrate 216. In addition to depositing on the substrate 216, the nitride layer may deposit on other exposed areas of the chamber 202 as well. The gaseous reaction product of the chloride compound and the nitrogen containing gas may include chlorine and nitrogen which may be evacuated out of the chamber thought the exhaust 226.

Once the deposition process is completed, the lamp module 228 may be turned off and the heater 209 output may be increased. The substrate 216 may be removed. The heater 209 output reduces or eliminates thermal expansion and thus any deposited nitride material may remain in place until the desired cleaning time and not flake off of the walls 208 and land on the susceptor 214 of incoming/outgoing substrate 216. Once the deposition process is completed, any nitride that has deposited on the walls 208 may be removed by introducing an etchant to etch the nitride off of the walls 208. During the cleaning, the lamp module 228 may be turned off and the majority of the heat may be from the heater 209 embedded within the walls 208. Once a new substrate 216 is placed into the chamber 202, the process may be repeated.

While the nitrogen containing gas is discussed as being introduced through the gas distribution showerhead 206 and the precursor delivered in the area corresponding to the middle of the chamber 202, it is to be understood that the gas introduction locations may be reversed. However, if the precursor is introduced through the showerhead 206, the showerhead 206 may be heated to increase the reactiveness of the chloride reaction product.

Figure 2B:
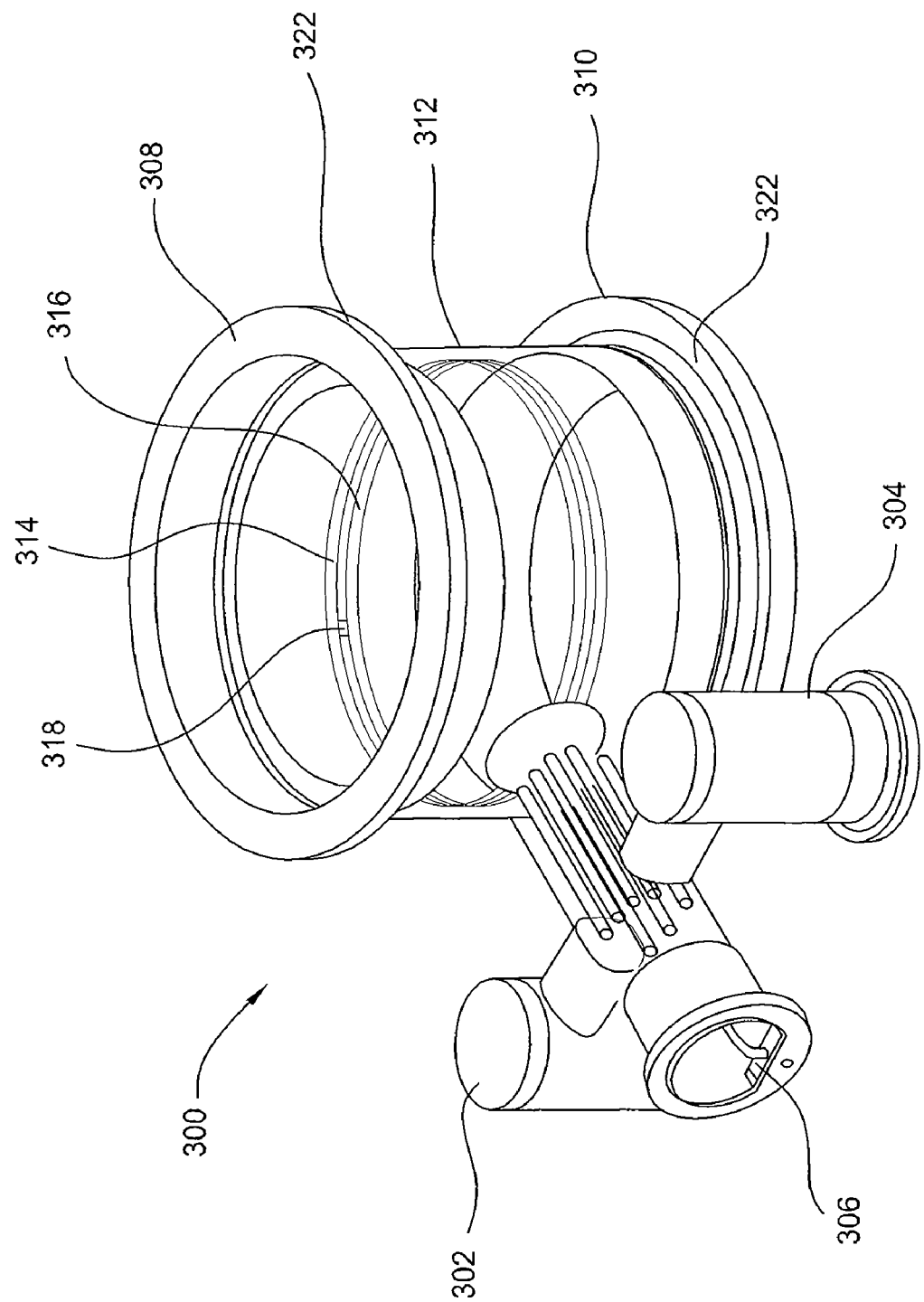
FIG. 2B is a schematic view of a HVPE chamber in accordance to one embodiment of the present invention.

FIG. 2B is a schematic isometric view of a HVPE chamber 300 according to another embodiment. The HVPE chamber 300 includes a first precursor source 302, a second precursor source 304, a passageway 306 for the chlorine gas to pass, an upper ring 308, a lower ring 310, and sidewalls 312. The chloride reaction product may enter the chamber through a first upper tube 314 and then evenly distribute therein before flowing to a second tube 316 through connectors 318 that are distributed between the tubes 314, 316. In one embodiment, the upper and lower rings 308, 310 comprise opaque quartz. In one embodiment, the sidewalls 312 may comprise clear quartz. In another embodiment, the tubes 314, 316 may comprise clear quartz. A lower liner disposed inside the lower ring 310 may comprise opaque quartz. The rings 308, 310 may have lips 322 that extend out from the sidewalls 312. O-rings may be disposed out at the edge of the lips 322 to ensure that the O-rings are as far away from the heated sidewalls 312 and lamp module as possible. O-rings typically are usable up until about 250 degrees Celsius. Therefore, moving the O-rings away from the chamber body is beneficial.

Figure 3:
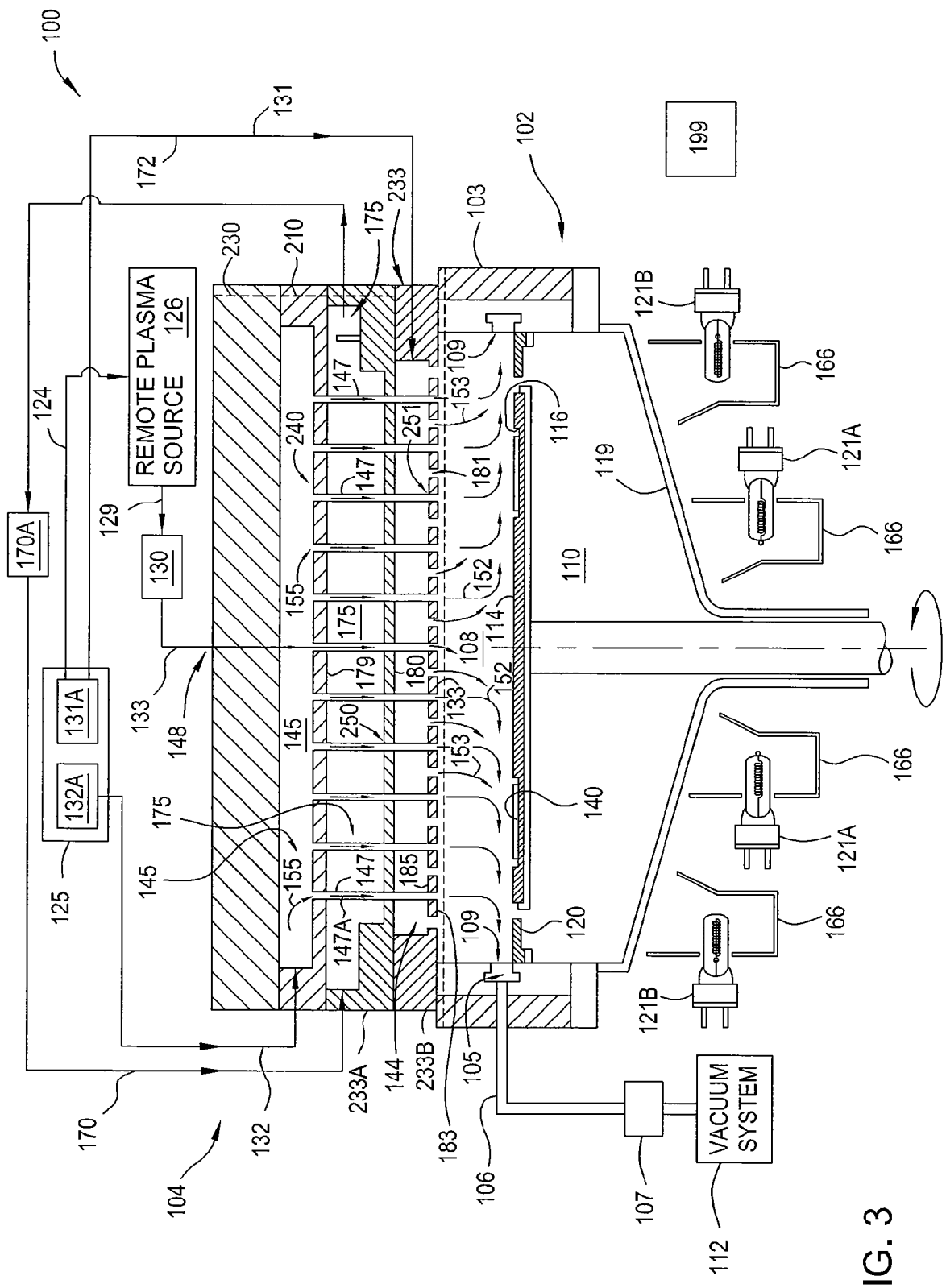
FIG. 3 is a schematic sectional side view of a MOCVD chamber in accordance with one embodiment of the present invention.

FIG. 3 is a schematic view of a MOCVD apparatus according to one embodiment of the invention The apparatus 100 comprises a chamber 102, a gas delivery system 125, a remote plasma source 126, and a vacuum system 112. The chamber 102 includes a chamber body 103 that encloses a processing region 108. A showerhead assembly 104 is disposed at one end of the processing region 108, and a substrate carrier 114 is disposed at the other end of the processing region 108. A lower dome 119 is disposed at one end of a lower volume 110, and the substrate carrier 114 is disposed at the other end of the lower volume 110. The substrate carrier 114 is shown in process position, but may be moved to a lower position where, for example, the substrates 140 may be loaded or unloaded. An exhaust ring 120 may be disposed around the periphery of the substrate carrier 114 to help prevent deposition from occurring in the lower volume 110 and also help direct exhaust gases from the chamber 102 to exhaust ports 109. The lower dome 119 may be made of transparent material, such as high-purity quartz, to allow light to pass through for radiant heating of the substrates 140. The radiant heating may be provided by a plurality of inner lamps 121A and outer lamps 121B disposed below the lower dome 119, and reflectors 166 may be used to help control chamber 102 exposure to the radiant energy provided by inner and outer lamps 121A, 121B. Additional rings of lamps may also be used for finer temperature control of the substrates 140.

The substrate carrier 114 may include one or more recesses 116 within which one or more substrates 140 may be disposed during processing. The substrate carrier 114 may carry six or more substrates 140. In one embodiment, the substrate carrier 114 carries eight substrates 140. It is to be understood that more or less substrates 140 may be carried on the substrate carrier 114. Typical substrates 140 may include sapphire, silicon carbide (SiC), silicon, or gallium nitride (GaN). It is to be understood that other types of substrates 140, such as glass substrates 140, may be processed. Substrate 140 size may range from 50 mm-150 mm in diameter or larger. The substrate carrier 114 size may range from 200 mm-750 mm. The substrate carrier 114 may be formed from a variety of materials, including SiC or SiC-coated graphite. It is to be understood that substrates 140 of other sizes may be processed within the chamber 102 and according to the processes described herein. The showerhead assembly 104, as described herein, may allow for more uniform deposition across a greater number of substrates 140 and/or larger substrates 140 than in traditional MOCVD chambers, thereby increasing throughput and reducing processing cost per substrate 140.

The substrate carrier 114 may rotate about an axis during processing. In one embodiment, the substrate carrier 114 may be rotated at about 2 RPM to about 100 RPM. In another embodiment, the substrate carrier 114 may be rotated at about 30 RPM. Rotating the substrate carrier 114 aids in providing uniform heating of the substrates 140 and uniform exposure of the processing gases to each substrate 140.

The plurality of inner and outer lamps 121A, 121B may be arranged in concentric circles or zones (not shown), and each lamp zone may be separately powered. In one embodiment, one or more temperature sensors, such as pyrometers (not shown), may be disposed within the showerhead assembly 104 to measure substrate 140 and substrate carrier 114 temperatures, and the temperature data may be sent to a controller (not shown) which can adjust power to separate lamp zones to maintain a predetermined temperature profile across the substrate carrier 114. In another embodiment, the power to separate lamp zones may be adjusted to compensate for precursor flow or precursor concentration nonuniformity. For example, if the precursor concentration is lower in a substrate carrier 114 region near an outer lamp zone, the power to the outer lamp zone may be adjusted to help compensate for the precursor depletion in this region.

The inner and outer lamps 121A, 121B may heat the substrates 140 to a temperature of about 400 degrees Celsius to about 1200 degrees Celsius. It is to be understood that the invention is not restricted to the use of arrays of inner and outer lamps 121A, 121B. Any suitable heating source may be utilized to ensure that the proper temperature is adequately applied to the chamber 102 and substrates 140 therein. For example, in another embodiment, the heating source may comprise resistive heating elements (not shown) which are in thermal contact with the substrate carrier 114.

A gas delivery system 125 may include multiple gas sources, or, depending on the process being run, some of the sources may be liquid sources rather than gases, in which case the gas delivery system may include a liquid injection system or other means (e.g., a bubbler) to vaporize the liquid. The vapor may then be mixed with a carrier gas prior to delivery to the chamber 102. Different gases, such as precursor gases, carrier gases, purge gases, cleaning/etching gases or others may be supplied from the gas delivery system 125 to separate supply lines 131, 132, and 133 to the showerhead assembly 104. The supply lines 131, 132, and 133 may include shut-off valves and mass flow controllers or other types of controllers to monitor and regulate or shut off the flow of gas in each line.

In one embodiment, the gas delivery system 125 comprises two or more sources, such as source 131A and source 132A. In one embodiment, source 131A is configured to deliver a process gas, such as nitrogen ($N_2$), ammonia ($NH_3$), hydrogen ($H_2$), or other MOCVD or HVPE processing gas, and gas source 132A is configured to deliver a precursor containing gas, such as a metal organic (MO) precursor. In one example, the precursor containing gas comprises a gallium containing precursor, such as gallium chloride (GaCl). Alternately, in some cases the source 131A is configured to deliver the precursor containing gas and source 132A is configured to deliver the process gas. In one example, the metal organic (MO) precursor is a Group III precursor such as trimethyl gallium ("TMG"), trimethyl aluminum ("TMAl"), and/or trimethyl indium ("TMI"), but other suitable MO precursors may also be used.

A conduit 129 may receive cleaning/etching gases from a remote plasma source 126. The remote plasma source 126 may receive gases from the gas delivery system 125 via supply line 124, and a valve 130 may be disposed between the showerhead assembly 104 and remote plasma source 126. The valve 130 may be opened to allow a cleaning and/or etching gas or plasma to flow into the showerhead assembly 104 via supply line 133 which may be adapted to function as a conduit for a plasma. In another embodiment, apparatus 100 may not include remote plasma source 126 and cleaning/etching gases may be delivered from gas delivery system 125 for non-plasma cleaning and/or etching using alternate supply line configurations to shower head assembly 104.

The remote plasma source 126 may be a radio frequency or microwave plasma source adapted for chamber 102 cleaning and/or substrate 140 etching. Cleaning and/or etching gas may be supplied to the remote plasma source 126 via supply line 124 to produce plasma species which may be sent via conduit 129 and supply line 133 for dispersion through showerhead assembly 104 into chamber 102. Gases for a cleaning application may include fluorine, chlorine or other reactive elements. Gases for a cleaning application may comprise a halogen containing gas, such as fluorine ($F_2$) or chlorine ($Cl_2$) or vapor comprising hydrochloric acid (HCl).

In another embodiment, the gas delivery system 125 and remote plasma source 126 may be suitably adapted so that precursor gases may be supplied to the remote plasma source 126 to produce plasma species which may be sent through showerhead assembly 104 to deposit CVD layers, such as III-V films, for example, on substrates 140.

A purge gas (e.g, nitrogen) may be delivered into the chamber 102 from the showerhead assembly 104 and/or from inlet ports or tubes (not shown) disposed below the substrate carrier 114 and near the bottom of the chamber body 103. The purge gas enters the lower volume 110 of the chamber 102 and flows upwards past the substrate carrier 114 and exhaust ring 120 and into multiple exhaust ports 109 which are disposed around an annular exhaust channel 105. An exhaust conduit 106 connects the annular exhaust channel 105 to a vacuum system 112 which includes a vacuum pump (not shown). The chamber 102 pressure may be controlled using a valve system 107 which controls the rate at which the exhaust gases are drawn from the annular exhaust channel 105.

The chamber 102 may also include a heat exchanging system 170 that is used to control the temperature of the various surface of the showerhead assembly 104. The heat exchanging system 170 may comprise a heat exchanger 170A that is coupled to one or more heat exchanging channels 175 (FIG. 2) formed in the showerhead assembly 104 via an inlet conduit 171 and an outlet conduit 172. The heat exchanging channel 175 through which a heat exchanging fluid flows is used to help regulate the temperature of the showerhead assembly 104. Suitable heat exchanging fluids include water, water-based ethylene glycol mixtures, a perfluoropolyether (e.g., Galden® fluid), oil-based thermal transfer fluids, or similar fluids. The heat exchanging fluid may be circulated through a heat exchanger 170A to raise or lower the temperature of the heat exchanging fluid as required to maintain the temperature of the showerhead assembly 104 within a desired temperature range. In one embodiment, the heat exchanging fluid is maintained within a temperature range of about 20 degrees Celsius to about 120 degrees Celsius. In another embodiment, the heat exchanging fluid may be maintained within a temperature range of about 100 degrees Celsius to about 350 degrees Celsius. In yet another embodiment, the heat exchanging fluid may be maintained at a temperature of greater than 350 degrees Celsius. The heat exchanging fluid may also be heated above its boiling point so that the showerhead assembly 104 may be maintained at higher temperatures using readily available heat exchanging fluids. Also, the heat exchanging fluid may be a liquid metal, such as gallium or gallium alloy.

The flow rate of the heat exchanging fluid may also be adjusted to help control the temperature of the showerhead assembly 104. Additionally, the thickness of the walls 179 and 180 surrounding the heat exchanging channel 175 may be designed to facilitate temperature regulation of various showerhead surfaces.

Control of the temperature of the various showerhead assembly 104 features, such as the gas conduits 147, the wall 180, and the showerhead face 183, is desirable to reduce or eliminate the formation of condensates on the showerhead assembly 104 as well as reduce gas phase particle formation and prevent the production of undesirable precursor reactant products which may adversely affect the composition of the film deposited on the substrates 140. In one embodiment, one or more thermocouples or other temperature sensors are disposed in proximity to showerhead face 183, heat exchanging channel 175, and/or wall 180 to measure the showerhead temperature. In another embodiment, one or more thermocouples or other temperature sensors are disposed in proximity to the inlet conduit 171 and/or the outlet conduit 172. The temperature data measured by the one or more thermocouples or other temperature sensors may be sent to a controller 199 which may adjust the heat exchanging fluid temperature and flow rate to maintain the showerhead temperature within a predetermined range. In one embodiment, the showerhead temperature may be maintained at about 50 degrees Celsius to about 350 degrees Celsius. In another embodiment, the showerhead temperature may be maintained at a temperature of greater than 350 degrees Celsius.

The showerhead assembly 104 is located near the substrate carrier 114 during substrate 140 processing. In one embodiment, the distance from the showerhead face 183 to the substrate carrier 114 during processing may range from about 4 mm to about 41 mm. In one embodiment, the showerhead face 183 is coplanar and faces the substrates 140 during processing.

In one embodiment, during processing a process gas 152 flows from the gas conduits 147 in the showerhead assembly 104 and a precursor containing gas 153 flows from the gas conduits 181 formed in the showerhead assembly 104 towards the substrate 140 surface. As noted above, the process gas 152 and/or precursor containing gas 153 may comprise one or more precursor gases or process gasses as well as carrier gases and dopant gases which may be mixed with the precursor gases. The draw of the annular exhaust channel 105 may affect gas flow so that the process gas 152 flows substantially tangential to the substrates 140 and may be uniformly distributed radially across the substrate 140 deposition surfaces in a laminar flow. The processing region 108 may be maintained at a pressure of about 760 Torr down to about 80 Torr.

Reaction of precursors, which may be found in the process gas 152 and/or precursor containing gas 153, at or near the substrate 140 surface may deposit various metal nitride layers upon the substrate 140, including GaN, aluminum nitride (AlN), and indium nitride (InN). Multiple metals may also be utilized for the deposition of other compound films such as AlGaN and/or InGaN. Additionally, dopants, such as silicon (Si) or magnesium (Mg), may be added to the films. The films may be doped by adding small amounts of dopant gases during the deposition process. For silicon doping, silane ($SiH_4$) or disilane ($Si_2H_6$) gases may be used, for example, and a dopant gas may include Bis(cyclopentadienyl) magnesium ($Cp_2Mg$ or $(C_5H_5)_2Mg$) for magnesium doping.

In one embodiment, the showerhead assembly 104 comprises a heat exchanging channel 175, a first plenum 144, a second plenum 145, and gas conduits 147. The heat exchanging channel 175 encircles the gas conduits 147, which protrude through the heat exchanging channel 175, so that the heat exchanging fluid can flow around and cool the gas or vapor flowing through a central region 147A of the gas conduits 147. The central region 147A of the gas conduits 147 are in fluid communication with the second plenum 145 and the processing region 108. In this configuration the heat exchanging channel 175 is disposed between the first plenum 144 and second plenum 145 to control the temperature of the gases or vapor delivered there through. Referring to FIG. 2, it is believed that a gas conduit and heat exchanging channel configuration that only requires half of the gas conduits (e.g., gas conduits 147) to extend through the heat exchanging channel 175 will greatly reduce the chances of the heat exchanging fluid leaking into the first plenum 144 or second plenum 145 at the junctions formed between the gas conduits (e.g., gas conduits 147) and the walls (e.g., walls 179 and 180). Only half of the gas conduits are required to extend through the heat exchanging channel 175, since only one gas plenum (e.g., second gas plenum 145) is disposed on one side of the heat exchanging channel 175 opposite the processing region 108, while the gas exiting the first plenum 144 enters directly into the processing region 108. Also, by positioning the heat exchanging channel 175 so that it is not directly adjacent to the processing region 108 the chances that a heat exchanging fluid leak will reach the processing region 108 is greatly reduced, thus reducing the chance of damage to the chamber and substrates 140. It is also believed that the leakage of the heat exchanging fluid into the processing region 108 can be dangerous at the typical processing temperature used to form LED and LD products, such as >750° C., due to the phase change created as the liquid heat exchanging fluid turns into a gas.

In one embodiment, the mid-plate 210 includes a plurality of gas conduits 147 which are disposed in the mid-plate holes 240 and extend down through heat exchanging channel 175 and into the bottom plate holes 250 and 251 located in a bottom plate 233. The gas conduits 147, which in one embodiment are metal tubes (e.g., SST, aluminum) are sealably coupled to the mid-plate 210 and wall 180 in the bottom plate 233 by use of a brazing or a welding technique to prevent the heat exchanging fluid from entering the first plenum 144 or the second plenum 145. In one embodiment, the gas conduits 147 are sealably coupled to the mid-plate 210, wall 180 and wall 185 to assure that the fluids flowing through the first plenum 144, second plenum 145 and heat exchanging channel 175 are all isolated from each other. The first plenum 144 is fluidly coupled to the processing region 108 through the conduits 181 formed in the wall 185 of the bottom plate 233. In one embodiment, the bottom plate 233 comprises a upper plate 233A and a lower plate 233B that are sealably coupled together to form the first plenum 144, and prevent the material delivered from the source 131A from leaking from of unwanted regions of the showerhead assembly 104. In one embodiment, the top plate 230, the mid-plate 210, upper plate 233A and lower plate 233B are formed from a metal, such as 316L stainless steel, INCONEL®, HASTELLOY®, electroless nickel plated aluminum, pure nickel, and other metals and alloys resistant to chemical attack, or even quartz.

The showerhead assembly 104 receives gases via supply lines 131, 132, and 133, which are coupled to the gas delivery system 125. In another embodiment, each supply line 131, 132 may comprise a plurality of lines which are coupled to and in fluid communication with the showerhead assembly 104. In one embodiment, a first precursor gas 154 (FIG. 3) and a second precursor gas 155 flow through supply lines 131 and 132 into the first plenum 144 and second plenum 145, respectively. In one embodiment, a non-reactive gas, which may be an inert gas such as hydrogen ($H_2$), nitrogen ($N_2$), helium (He), argon (Ar) or other gases and combinations thereof, may flow through a supply line 133, which is configured to selectively deliver the non-reactive gases to various regions in the showerhead assembly 104.

In one embodiment, a cleaning and/or etching gas or plasma is delivered through the central conduit 148 into the chamber 102. The central conduit 148 is adapted to disperse the cleaning and/or etching gas or plasma inside chamber 102 to provide more effective cleaning. In other embodiments, the apparatus 100 is adapted to deliver cleaning and/or etching gas or plasma into chamber 102 through other routes, such as through the gas conduits 147 and/or conduits 181 in the showerhead assembly 104. In one embodiment, a fluorine or chlorine based plasma is used for etching or cleaning. In other embodiments, halogen gases, such as $Cl_2$, Br, and $I_2$, or halides, such as HCl, HBr, and HI, are used for non-plasma etching.

The second precursor gas 155 flows from the supply line 132 into the second plenum 145 and into gas conduits 147, which are fluid communication with the processing region 108. The first plenum 144 is not in fluid communication with the second plenum 145 so that the first and second precursor gases 154, 155 remain isolated until injected into the processing region 108 of the chamber 102.

In one embodiment, the first precursor gas 154 which is delivered to first plenum 144 may comprise a Group V precursor, and second precursor gas 155 which is delivered to second plenum 145 may comprise a Group III precursor. In another embodiment, the precursor delivery may be switched so that the Group V precursor is routed to second plenum 145 and the Group III precursor is routed to first plenum 144. The choice of first or second plenum 144, 145 for a given precursor may be determined in part by the distance of the plenum from the heat exchanging channel 175 and the desired temperature ranges which may be maintained for each plenum and the precursor therein. The Group V precursor may be a nitrogen precursor, such as ammonia ($NH_3$).

Multiple Chamber Process

Figure 4:
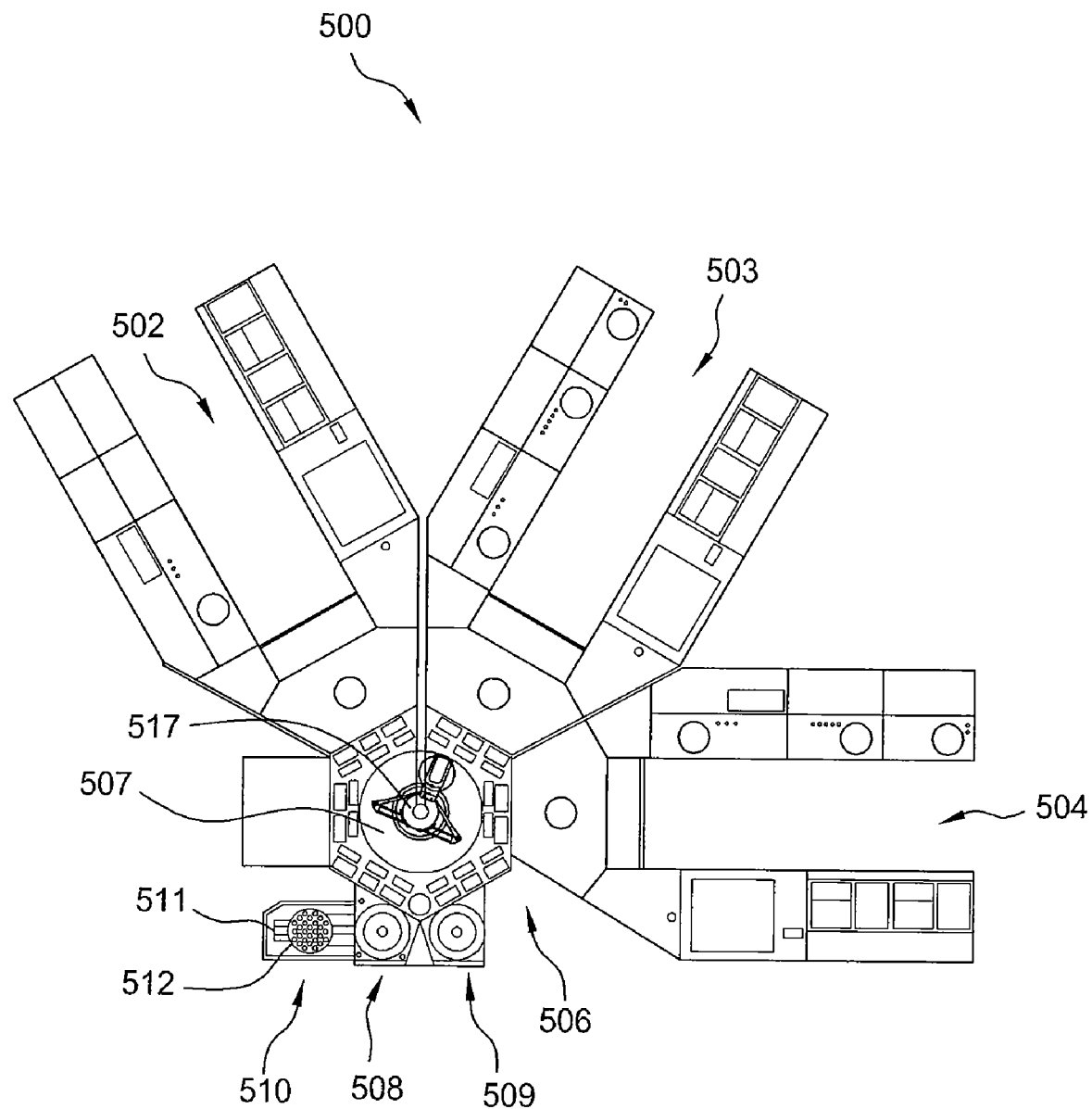
FIG. 4 is a plan view of a cluster tool in accordance with one embodiment of the present invention.

FIG. 4 is a plan view of a cluster tool 500 in accordance with one embodiment of the present invention. The cluster tool 500 is configured to form nitride compound structures for LED.

The cluster tool 500 comprises a transfer chamber 506, a load lock chamber 508 coupled to the transfer chamber, a load station 510 coupled to the load lock chamber 508, and a batch loadlock chamber 509 coupled to the transfer chamber 506.

The cluster tool 500 comprises three processing chambers 502, 503, 504 connected to the transfer chamber 506. In one embodiment, the processing chambers 502, 503, 504 are configured to efficiently form different layers of a LED structure.

In one embodiment, the first processing chamber 502 is a HVPE chamber coupled to the transfer chamber 506, and the processing chambers 503, 504 are MOCVD chambers. In another embodiment, all three processing chambers 502, 503, 504 are MOCVD chambers.

In one embodiment, the HVPE chamber 502 may be similar to the HVPE chamber 200 of FIG. 2A. The HVPE chamber 502 is adapted to perform HVPE processes in which gaseous metal halides are used to epitaxially grow thick layers of compound nitride semiconductor materials on heated substrates. The HVPE chamber 502 may be configured to optimize deposition rate of n-doped group-III metal nitride layer in a nitride based LED structure. The MOCVD chambers 503, 504 may be similar to the MOCVD chamber 100 of FIG. 3A. The MOCVD chambers 503, 504 are adapted to perform CVD processes in which metal organic elements react with metal hydride elements to form thin layers of compound nitride semiconductor materials.

The cluster tool 500 further comprises a load lock chamber 508 coupled with the transfer chamber 506 and a load station 510 coupled with the load lock chamber 508. The load lock chamber 508 and the load station 510 are configured to loading substrates to the first processing chamber (HVPE chamber) 502 and the second processing chamber (MOCVD chamber) 504 through the transfer chamber 506. In one embodiment, the cluster tool 500 further comprises a batch load lock chamber 509, configured for storing substrates, coupled with the transfer chamber 506.

The load station 510 is configured as an atmospheric interface to allow an operator to load a plurality of substrates for processing into the confined environment of the load lock chamber 508, and unload a plurality of processed substrates from the load lock chamber 508. In one embodiment, substrates for processing may be grouped in batches and transported by a conveyor tray 511 on a carrier plate 512.

In another embodiment, the load station 510 may be an automatic substrate loader for loading and unloading substrates to and from the multi-chamber processing system. The automatic substrate loader comprises a cassette handling mechanism, a substrate aligner configured to align a substrate, and a carrier tray aligner. The automatic substrate loader further comprises a first robot configured to transfer substrates between the substrate aligner and the substrate storage cassettes, and a second robot configured to transfer substrates between the substrate aligner and the carrier tray disposed on the carrier tray aligner. The automatic substrate loader further comprises a third robot configured to transfer a substrate carrier tray between the automatic substrate loader and a substrate processing system. In one embodiment, the cassette handling mechanism, the substrate aligner and the carrier tray aligner are arranged to enable the first, second, and third robots to have only linear motions therefore simplifies the system.

The load lock chamber 508 provides an interface between the atmospheric environment of the load station 510 and the controlled environment of the transfer chamber 506. Substrates are transferred between the load lock chamber 508 and the load station 510 via the slit valve and between the load lock chamber 508 and the transfer chamber 506 via another slit valve. In one embodiment, the load lock chamber 508 may comprise multiple carrier supports that are vertically stacked. The carrier supports may be vertically movable to facilitate loading and unloading of a carrier plate 512.

The load lock chamber 508 is coupled to a pressure control system (not shown) which pumps down and vents the load lock chamber 508 to facilitate passing the substrate between the vacuum environment of the transfer chamber 506 and the substantially ambient (e.g., atmospheric) environment of the load station 510. In addition, the load lock chamber 508 may also comprise features for temperature control.

The transfer chamber 506 is generally maintained at a vacuum state or a low pressure state. In one embodiment, the transfer chamber 506 may have a controlled environment maintained by an inert gas, such as helium gas and nitrogen gas, a reducing gas, such as ammonia, or combinations thereof.

The robot assembly 517 is operable to pick up and transfer substrates between the load lock chamber 508, the batch load lock chamber 509, the MOCVD chamber 504 and the HVPE chamber 502. In one embodiment, the robot assembly 517 may comprise heated end effectors configured to keep the substrates at elevated temperature during transfer. In one embodiment, the substrates are maintained at a temperature higher than about 350° C. during transferring among the processing chambers.

The batch load lock chamber 509 having a cavity for storing a plurality of substrates placed on the carrier plates 512 therein. A storage cassette may be moveably disposed within the cavity. The storage cassette may comprise a plurality of storage shelves supported by a frame. In one embodiment, the batch load lock chamber 509 may be configured to clean the substrates prior processing. In one embodiment, the batch load lock chamber 509 may have one or more heaters configured to heat the substrates disposed therein and may be connected to an inert gas source and/or a cleaning gas source to perform a thermal cleaning to the substrates prior processing.

Once a carrier plate loaded with substrates has been conditioned in the load lock chamber 508, the carrier plate may be transferred into the MOCVD chamber 504, the MOCVD chamber 503, or the HVPE chamber 502 for processing, or to the batch load lock chamber 509 where multiple carrier plates are stored in standby for processing.

During operation, a carrier plate 512 containing a batch of substrates is loaded on the conveyor tray 511 in the load station 510. The conveyor tray 511 is then moved through the slit valve into the load lock chamber 508, placing the carrier plate 512 onto the carrier support inside the load lock chamber 508, and the conveyor tray returns to the load station 510. While the carrier plate 512 is inside the load lock chamber 508, the load lock chamber 508 is pumped and purged with an inert gas, such as nitrogen, in order to remove any remaining oxygen, water vapor, and other types of contaminants. After the batch of substrates have been conditioned in the batch load lock chamber 509, the robot assembly 517 may transfer the carrier plate 512 to either the MOCVD chamber 504 or, the HVPE chamber 502 to undergo deposition processes. In alternate embodiments, the carrier plate 512 may be transferred and stored in the batch load lock chamber 509 on standby for processing in either the MOCVD chamber 504 or the HVPE chamber 502. After processing of the batch of substrates is complete, the carrier plate 512 may be transferred to the load lock chamber 508, and then retrieved by the conveyor tray 511 and returned to the load station 510.

The processing chamber 502 is configured to deposit layers for a LED structure prior to deposition of a MQW layer. In one embodiment, the processing chamber 502 is a HVPE chamber configured to rapid formation of n-doped GaN. In another embodiment, the processing chamber 502 may be a MOCVD chamber.

In one embodiment, the processing chamber 503 configured to deposit a MQW layer of a LED structure. In one embodiment, the processing chamber 503 may be a MOCVD chamber configured to form a MQW layer comprising InGaN.

In one embodiment, the processing chamber 504 is configured to deposit subsequent layers after a MQW layer of a LED structure. In one embodiment, the processing chamber 504 is a MOCVD chamber.

In one embodiment, the processing chamber 502 may be a HVPE similar to the HVPE chamber 200 of FIG. 2A. The processing chamber 502 is adapted to perform HVPE processes in which gaseous metal halides are used to epitaxially grow thick layers of compound nitride semiconductor materials on heated substrates. The MOCVD chambers 503, 504 may be similar to the MOCVD chamber 100 of FIG. 3A.

Figure 5:
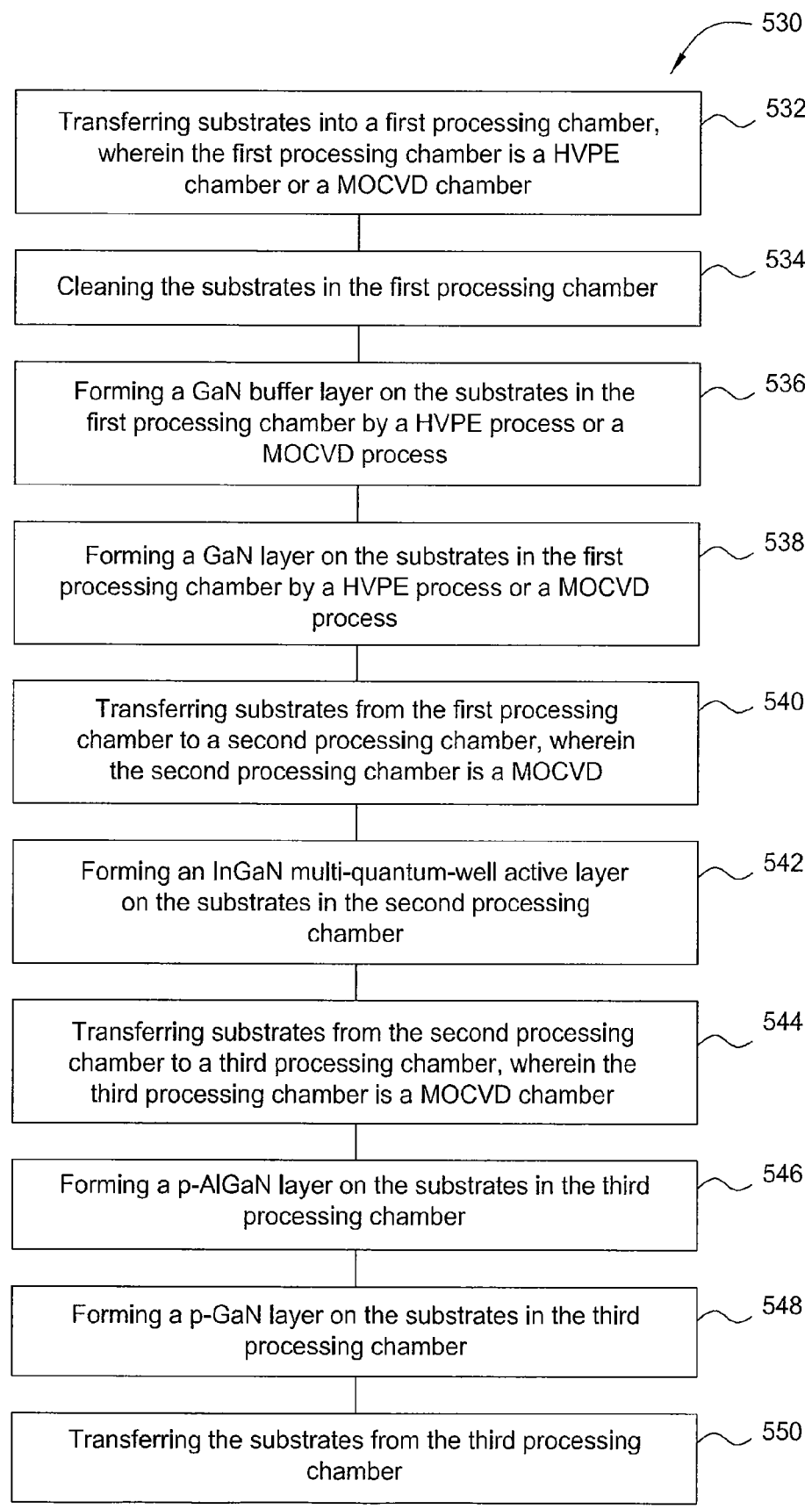
FIG. 5 is a flow chart of a processing sequence in accordance with one embodiment of the present invention.

FIG. 5 is a flow chart of a processing sequence 530 in accordance with one embodiment of the present invention. The processing sequence 530 describes a method for fabricating gallium nitride based LED structure using the cluster tool 500.

In block 532 of the processing sequence 530, a plurality of substrates are transferred to a first processing chamber, such as the processing chamber 502.

In block 534 of the processing sequence 530, the plurality of substrates are cleaned in the processing chamber 502. A cleaning procedure may be performed by flowing a cleaning gas to the processing chamber 502 for a predetermined period, for example about 10 minutes, and at an elevated temperature, for example about 1050° C.

In block 536 of the processing sequence 530, a GaN buffer layer is rapidly formed on the cleaned the substrate. The GaN buffer layer is formed from precursors of gallium and nitrogen by a HVPE process.

In block 538 of the processing sequence 530, a n-doped GaN layer is formed on the buffer layer by a HVPE process. In one embodiment, the processing chamber 502 is a HVPE chamber configured to perform rapid deposition of the n-doped GaN layer.

In block 540 of the processing sequence 530, the plurality of substrates are transferred from the processing chamber (HVPE chamber) 502 to the processing chamber (MOCVD chamber) 503 via the transfer chamber 506. In one embodiment, the transfer taking place in a high-purity N2 atmosphere via the transfer chamber 506.

In block 542 of the processing sequence 530, a multi-quantum-well (MQW) layer comprising Indium, gallium and nitrogen (InGaN) is formed on the substrates by a MOCVD process. The processing chamber (MOCVD chamber) 503 is adapted to provide highly uniform deposition, perhaps at the expense of overall deposition rate.

In block 544 of the processing sequence 530, the substrates are transferred from the processing chamber (MOCVD chamber) 503 to the processing chamber (MOCVD chamber) 504 via the transfer chamber 506.

In block 546 of the processing sequence 530, a p-doped AlGaN layer is formed on the substrates in the processing chamber (MOCVD chamber) 504.

In block 548 of the processing sequence 530, a p-doped GaN layer is formed on the substrates in the processing chamber (MOCVD chamber) 504.

In block 550 of the processing sequence 530, the substrates are transferred out of the processing chamber (MOCVD chamber) 504 and out of the cluster tool 500.

By using a HVPE chamber to form the n-doped GaN layer rapidly and using MOCVD chambers to form the MQW layer and subsequent layers uniformly, embodiments of the present invention increase throughput while maintaining uniformity. By using two separate MOCVD chambers to form the InGaN and AlGaN layers, embodiments of the present invention further increase system throughput by eliminating cleaning and adjustment to the process chambers when the InGaN and AlGaN layers are formed in the same chamber.

Figure 6:
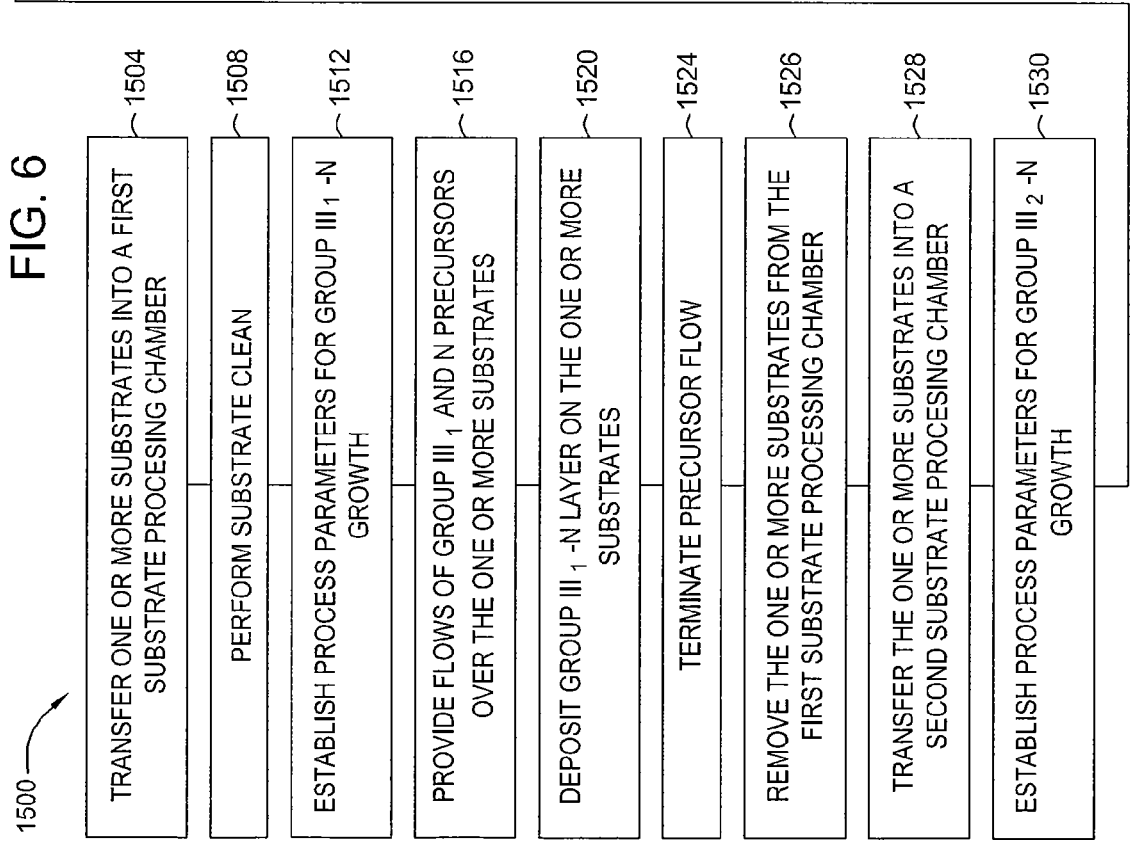
FIG. 6 is a flow diagram of a process that may be used for multiple chamber compound nitride semiconductor formation according to embodiments described herein.

FIG. 6 is a flow diagram of a process 1500 that may be used for multiple chamber compound nitride semiconductor formation according to embodiments described herein. In one embodiment, the process 1500 may be performed in a cluster tool system, such as the cluster tool 500 of FIG. 4.

The process begins at block 1504 by transferring one or more substrates into a first substrate processing chamber. In one embodiment, the first substrate processing chamber is a MOCVD chamber. In another embodiment, the first substrate processing chamber is similar to a HVPE chamber. For deposition of a nitride structure, the one or more substrates may comprise sapphire, although other materials that may be used include SiC, Si, spinel, lithium gallate, ZnO, and others.

The one or more substrates are cleaned at block 1508, after which process parameters suitable for growth of a nitride layer may be established at block 1512. Such process parameters may include temperature, pressure, and the like to define an environment within the processing chamber appropriate for thermal deposition of a nitride layer.

Flows of precursors are provided at block 1516 on the one or more substrates to deposit $III_1$-N structures on the one or more substrates at block 1520. In one embodiment, the precursors include a nitrogen source and a source for a first group-III element such as Ga. In one embodiment, the nitrogen precursor is $NH_3$. In another embodiment, the nitrogen source may be one or more active nitrogen species derived from a remote plasma of a nitrogen-containing material such as nitrogen gas ($N_2$), nitrous oxide ($N_2O$), ammonia ($NH_3$), hydrazine ($N_2H_4$), diimide ($N_2H_2$), hydrazoic acid ($HN_3$), and the like. In one embodiment, the flow rate of the nitrogen source may be between about 3000 sccm to about 9000 sccm. A suitable Ga precursor includes, for example, trimethyl gallium ("TMG"). The first group-III element may sometimes comprise a plurality of distinct group-III elements such as Al and Ga, in which case a suitable Al precursor may be trimethyl aluminum ("TMA"). In another example, the plurality of distinct group-III elements includes In and Ga, in which case a suitable In precursor may be trimethyl indium ("TMI"). A flow of one or more carrier gases selected from the group of argon, nitrogen, hydrogen, helium, neon, xenon, and combinations thereof may also be included.

After deposition of the $III_1$-N structure at block 1520, the precursor flows are terminated at block 1524. The one or more substrates are removed from the processing chamber without exposing the substrate to atmosphere at block 1526. Removing the substrate from the processing chamber without braking vacuum prevents exposure of the deposited $III_1$-N structure to oxygen and carbon which act as electrically active dopants/impurities.

At block 1528, the substrate is transferred under vacuum to a second processing chamber. In one embodiment, the second substrate processing chamber is a MOCVD chamber.

After the substrate is transferred into the second processing chamber at block 1528 subsequent deposition steps are performed in the second processing chamber.

At block 1530, process parameters suitable for growth of a $III_2$-N layer may be established. Such process parameters may include temperature, pressure, and the like to define an environment within the processing chamber appropriate for thermal deposition of a nitride layer. Flows of precursors are provided at block 1532 on the one or more substrates to deposit $III_2$-N structures on the substrate at block 1536.

In some embodiments, the $III_2$-N structure includes a group-III element that is not comprised by the $III_1$-N layer, although the $III_1$-N and $III_2$-N layers may additionally comprise a common group-III element. For instance, in the case where the $III_1$-N layer is GaN, the $III_2$-N layer may be an AlGaN layer or an InGaN layer. While these are examples in which the $III_2$-N layer has a ternary composition, this is not required and the $III_2$ layer may more generally include such other compositions as quaternary AlInGaN layers. Similarly, in embodiments where the $III_1$-N layer is AlGaN, the $III_2$-N layer may be an InGaN layer on an AlInGaN layer. Suitable precursors for deposition of the $III_2$-N layer may be similar to the precursors used for the $III_1$-N layer, i.e. $NH_3$ is a suitable nitrogen precursor, TMG is a suitable gallium precursor, TMA is a suitable aluminum precursor, and TMI is a suitable indium precursor. A flow of one or more carrier gases selected from the group of argon, nitrogen, hydrogen, helium, neon, xenon, and combinations thereof may also be included.

After deposition of the $III_2$-N structure at block 1536, the precursor flows are terminated at block 1538. The one or more substrates are removed from the second processing chamber without exposing the one or more substrates to atmosphere at block 1540. Removing the one or more substrates from the processing chamber without braking vacuum prevents exposure of the deposited $III_2$-N structure to oxygen and carbon which act as electrically active dopants/impurities.

At block 1542, the one or more substrates are transferred under vacuum to a third substrate processing chamber. In one embodiment, the third substrate processing chamber is a MOCVD chamber. After the one or more substrates are transferred into the third processing chamber at block 1542 subsequent deposition steps are performed in the third processing chamber.

At block 1544, process parameters suitable for growth of a $III_3$-N layer may be established. Such process parameters may include temperature, pressure, and the like to define an environment within the processing chamber appropriate for thermal deposition of a nitride layer. Flows of $III_3$ and nitrogen precursors are provided at block 1546 on the substrate to deposit $III_3$-N structures on the substrate at block 1548. At block 1550, the precursor flows are terminated.

The processing conditions used for deposition of the $III_1$-N, the $III_2$-N, and the $III_3$-N layers may vary depending on specific applications. Table 1 below provides exemplary processing conditions and precursor flow rates that are generally suitable in the growth of nitride semiconductor structures using the devices described above:

TABLE 1

| Parameter | Value |
| --- | --- |
| Temperature (° C.) | 500-1200 |
| Pressure (Torr) | 5-760 |
| TMG flow (sccm) | 0-50 |
| TMA flow (sccm) | 0-50 |
| TMI flow (sccm) | 0-50 |
| $PH_3$ flow (sccm) | 0-1000 |
| $AsH_3$ flow (sccm) | 0-1000 |
| $NH_3$ flow (sccm) | 100-100,000 |
| $N_2$ flow (sccm) | 0-100,000 |
| $H_2$ flow (sccm) | 0-100,000 |
| $Cp_2Mg$ | 0-2,000 |

As will be evident from the preceding description, a process might not use flows of all the precursors in any given process. For example, growth of GaN might use flows of TMG, $NH_3$, and $N_2$ in one embodiment; growth of AlGaN might use flows of TMG, TMA, $NH_3$, and $H_2$ in another embodiment, with the relative flow rates of TMA and TMG selected to provide a desired relative Al:Ga stoichiometry of the deposited layer; and growth of InGaN might use flows of TMG, TMI, $NH_3$, $N_2$, and $H_2$ in still another embodiment, with relative flow rates of TMI and TMG selected to provide a desired relative In:Ga stoichiometry of the deposited layer.

Optionally, a cleaning process may be performed in which the interior of each processing chamber is exposed to a cleaning gas to remove gallium containing deposits from the chamber and chamber components after removal of the substrate from the processing chamber. In one embodiment, the cleaning process may comprise exposing the chamber to etchant gases which thermally etch deposition from chamber walls and surfaces. Optionally, the processing chamber may be exposed to a plasma during the cleaning process. Cleaning gases for the cleaning process may include halogen containing gases such as fluorine containing gases, chlorine containing gases, iodine containing gases, bromine containing gases, and/or other reactive elements. A flow of one or more carrier gases selected from the group of argon, nitrogen, hydrogen, helium, neon, xenon, and combinations thereof may also be included. In one embodiment, the cleaning process comprises exposing the chamber to a plasma. In one embodiment, the plasma is generated by a remote plasma generator. In another embodiment, the plasma is generated in-situ.

Example

Figure 7:
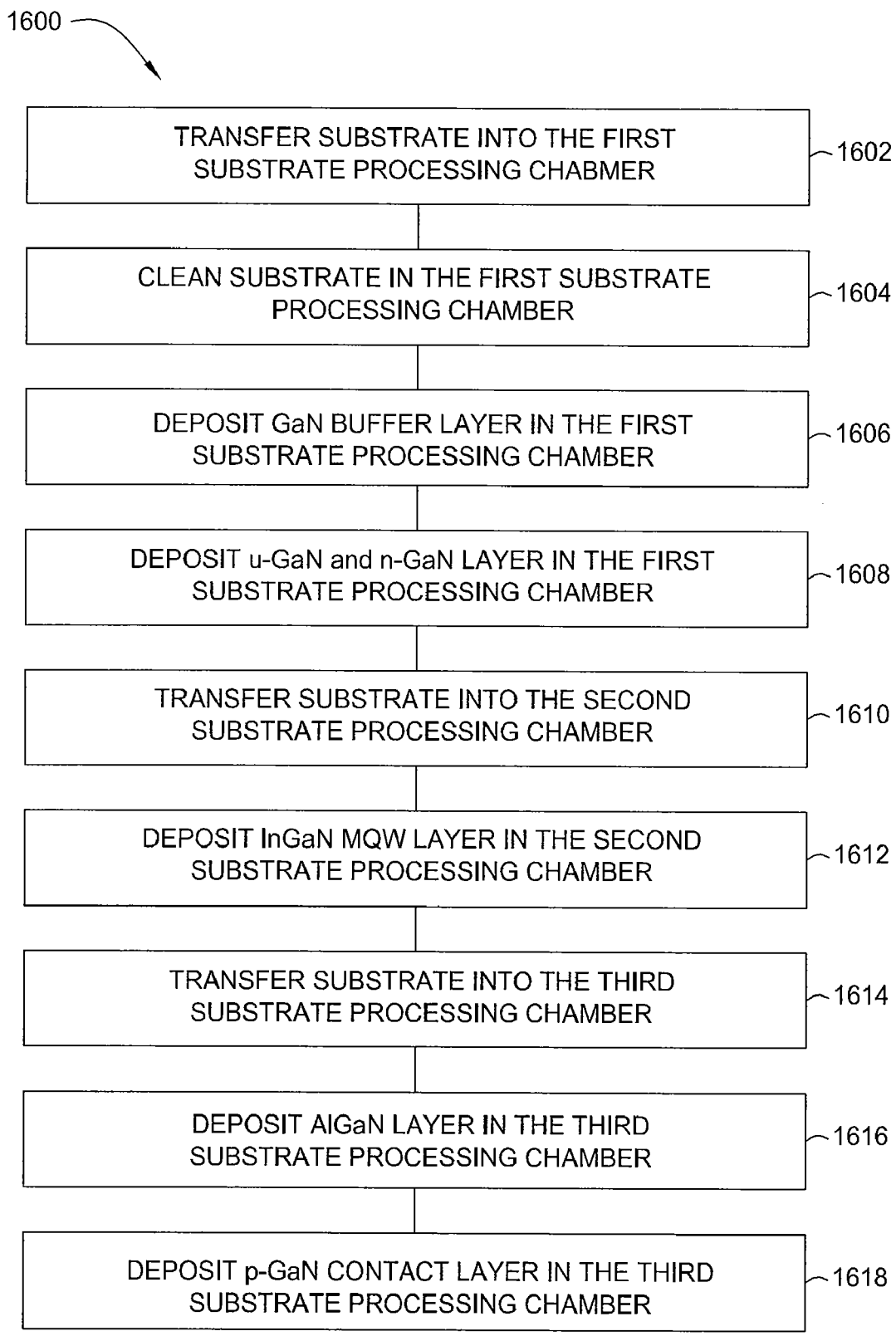
FIG. 7 is a flow diagram of another process that may be used for multiple chamber compound nitride semiconductor formation according to embodiments described herein.

The following example is provided to illustrate how the general process may be used for the fabrication of compound nitride structures described in connection with the cluster tool 500. The example refers to a LED structure, with its fabrication being performed using the cluster tool 500, wherein the chamber 502 is a HVPE chamber or a MOCVD chamber, and chambers 503, 504 are MOCVD chambers. In one embodiment, the LED structure is similar to structure 10 of FIG. 1A. An overview of the process is provided with the flow diagram of FIG. 7. The deposition of the initial $III_1$-N layers (e.g., the GaN layers) is performed either in the chamber 502 by a MOCVD process or a HVPE process, deposition of $III_2$-N layers (e.g., the InGaN layer) is performed in the second MOCVD chamber 503, and deposition of the $III_3$-N layers (e.g. the AlGaN, and GaN contact layers) is performed in the third MOCVD chamber 504.

At block 1602 one or more sapphire substrates are transferred into the first substrate processing chamber. In one embodiment, where the first substrate processing chamber is an MOCVD chamber, a carrier plate containing one or more substrates is transferred into the first chamber 502. In one embodiment, the first chamber 502 is configured to provide rapid deposition of GaN.

At block 1604, the substrate is cleaned in the first substrate processing chamber. In one embodiment, the one or more substrates are cleaned by flowing chlorine gas at a flow rate between 200 sccm to about 1000 sccm and ammonia at a flow rate between 500 sccm to about 9000 sccm within a temperature range between about 625° C. to about 1000° C. In another embodiment, the cleaning gas comprises ammonia and a carrier gas.

At block 1606, a pretreatment process and/or buffer layer is grown over the substrate in the MOCVD chamber 503 using MOCVD precursor gases, for example, TMG, $NH_3$, and $N_2$ at a temperature of 550° C. and a chamber pressure of from about 100 Torr to about 600 Torr. In one embodiment, the pressure is about 300 Torr.

This is followed by growth of a thick u-GaN/n-GaN layer, which in this example is performed using MOCVD precursor gases, for example, TMG, $NH_3$, and $N_2$ at a temperature of 1050° C. and a chamber pressure of from about 100 Torr to about 600 Torr at block 1608. In one embodiment, the pressure is about 300 Torr.

At block 1606, a pretreatment process and/or buffer layer is grown over the substrate in the HVPE chamber 502 using HVPE precursor gases, for example, $GaCl_3$ and $NH_3$ at a temperature of about 550° C. at a chamber pressure of from about 100 Torr to about 600 Torr. In one embodiment, the chamber pressure is about 450 Torr. This is followed by growth of a thick u-GaN/n-GaN layer, which in this example is performed using HVPE precursor gases, for example, GaCl₃ and NH₃ at a temperature of about 1050° C. and a chamber pressure of about 450 Torr at block 1608.

In one embodiment, the GaN film is formed over the sapphire substrates by a HVPE process at a temperature between about 700° C. to about 1100° C. by flowing a gallium containing precursor and ammonia. The gallium containing precursor is generated by flowing chlorine gas at a flow rate between about 20 sccm to about 150 sccm over liquid gallium maintained at a temperature between 700° C. to about 950° C. In one embodiment, the liquid gallium is maintained at a temperature of about 800° C. Ammonia is flown to the processing chamber at a flow rate within the range between about 6 SLM to about 20 SLM. The GaN has a growth rate between about 0.3 microns/hour to about 25 microns/hour, with growth rates up to about 100 microns/hour achievable.

At block 1610, after deposition of the u-GaN and n-GaN layer, the carrier plate is transferred out of either the first chamber 502 and into the MOCVD chamber 503 without breaking vacuum, with the transfer taking place in a high-purity N₂ atmosphere via the transfer chamber 506. In the MOCVD chamber 503 the InGaN multi-quantum-well (MQW) active layer is grown using MOCVD precursor gases, for example, TMG, TMI, and NH₃ in a H₂ carrier gas flow at a temperature of from about 750° C. to about 800° C. and a chamber pressure of from about 100 Torr to about 300 Torr at block 1612. In one embodiment, the chamber pressure is about 300 Torr.

After deposition of the InGaN MQW layer, at block 1614 the carrier plate is transferred out of the MOCVD chamber 503 and into the MOCVD chamber 504 without breaking vacuum, with the transfer taking place in a high-purity N₂ atmosphere via the transfer chamber 506. In the MOCVD chamber 504, at block 1616, the p-AlGaN layer is grown using MOCVD precursors, such as, TMA, TMG, and NH₃ provided in a H₂ carrier gas flow at a temperature of about 1020° C. and a pressure of about 200 Torr. At block 1618, the p-GaN layer is grown using flows of TMG, NH₃, Cp₂Mg, and N₂ at a temperature of 1020° C. and a pressure of about 100 Torr. In one embodiment, the p-GaN layer is grown in an ammonia free environment using flows of TMG, Cp₂Mg, and N₂ at a temperature of between about 850° C. and about 1050° C. During formation of the p-GaN layer, the one or more substrates are heated at a temperature ramp-up rate between about 5° C./second to about 10° C./second.

It has been found by the inventors that in certain embodiments for p-GaN processes, the use of a much higher temperature ramp rate (5° C./second to about 10° C./second in comparison with the conventional ramping rate of 0.5° C./second to about 1° C./second and the elimination of ammonia during the temperature ramping process eliminates InGaN MQW and supperlattice (SL) degradation during the high-temperature ramping process. It has been further found by the inventors that in certain embodiments, the use of a lower p-GaN growth temperature, from about 850° C. to about 950° C. compared with the conventional temperature of from about 1050° C. to about 1100° C. is favorable for the InGaN structure and significantly reduces if not completely eliminates MQWs and SLs degradation and phase separation in both binary and ternary systems.

Optionally, after removal of the carrier plate from each of the first chamber 502 (HVPE or MOCVD), the MOCVD chamber 503, or the MOCVD chamber 504, an in-situ chamber clean process may be performed with cleaning gas. The cleaning gas may include any suitable halogen containing gas. Suitable halogen containing gases include fluorine, chlorine, iodine, bromine, and/or other reactive elements. In one embodiment, the cleaning gas is a chlorine containing cleaning gas. In one embodiment, each processing chamber may be cleaned after removal of a carrier plate and prior to insertion of another carrier plate. In one embodiment, each processing chamber may be cleaned periodically. In one embodiment, the frequency and/or duration of each cleaning may be determined based on the thickness of each layer deposited. For example, a cleaning process performed after deposition of a thin layer would be shorter than a cleaning process performed after deposition of a thicker layer. In one embodiment, the first processing chamber may be cleaned after each u-GaN and n-GaN deposition process. In one embodiment, the MOCVD chamber 503 may be cleaned periodically, for example after fifty deposition cycles. In one embodiment, the MOCVD chamber 504 may be cleaned after the removal of each carrier plate.

After the p-AlGaN and p-GaN layers are grown, the completed structure is then transferred out of the MOCVD chamber 504. The completed structure may either be transferred to the batch loadlock chamber 509 for storage or may exit the cluster tool 500 via the loadlock chamber 508 and the load station 510.

In one embodiment, multiple carrier plates may be individually transferred into and out of each substrate processing chamber for deposition processes, each carrier plate may then be stored in the batch loadlock chamber 509 and/or the loadlock chamber 508 while either the subsequent processing chamber is being cleaned or the subsequent processing chamber is currently occupied.

Figure 8:
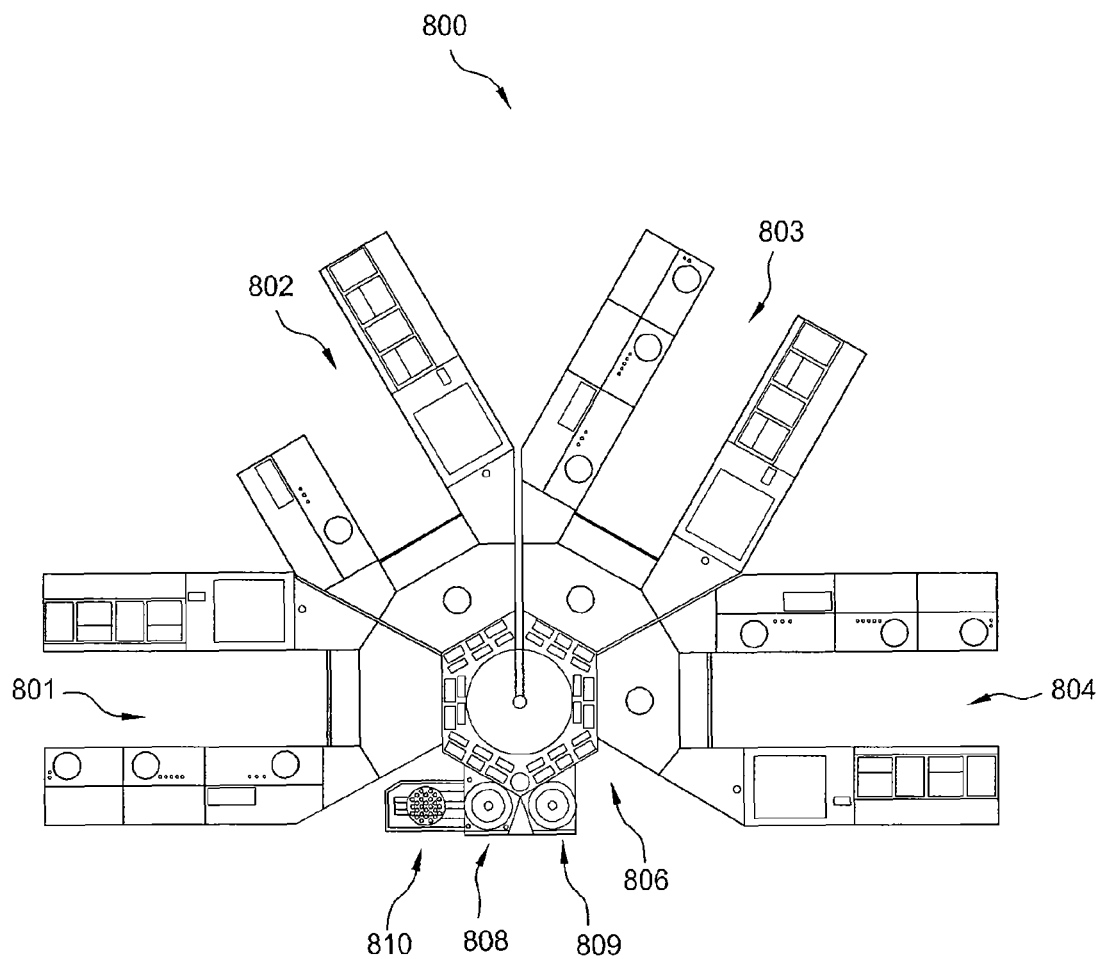
FIG. 8 is a plan view of a cluster tool in accordance with one embodiment of the present invention.

Table 2 demonstrates that the full LED parameters for an LED grown using the multiple chamber deposition processes described herein. The multiple chamber split process described herein provides superior results in comparison with a conventional one chamber in-situ process. As shown in FIG. 8, the photoluminescence intensity for the multiple chamber split process is extremely high 7+V compared to approximately 1 V for an in-situ process at a desirable wavelength while variance in thickness uniformity is extremely low at about 1% in comparison with greater than 2% for an in-situ process. Period thickness and photoluminescence uniformity are also at spec level. Consistent and reproducible results were demonstrated with the highest LED photoluminescence of 10 V at 450 nm wavelength.

TABLE 2

|  | Thickness [um] | Thickness Uniformity [%] | XRD (002) | XRD (102) |  | PL Wavelength [nm] | Intensity [a.u.] | FWHM (nm) | Uniformity (nm) | (002) Omega 2 theta period splits | (002) Omega 2 theta period thickness |
|---|---|---|---|---|---|---|---|---|---|---|---|
| Outer | 4.68 | 1.08% | 269.65 | 546.75 | Outer | 459.61 | 7.42 | 22.53 | 2.71 | 939 | 177 |
| Middle | 4.72 | 1.00% | 275.85 | 554.20 | Middle | 454.09 | 7.72 | 22.03 | 2.37 | 938 | 177 |
| Inner | 4.70 | 1.16% | 277.80 | 573.65 | Inner | 455.90 | 6.58 | 22.90 | 2.83 | 893 | 187 |
| Average | 4.69 | 0.01% | 274.43 | 558.20 | Average | 459.6 | 7.42 | 22.5 | 2.71 | 923 | 180 |

FIG. 8 is a plan view of a cluster tool 800 in accordance with one embodiment of the present invention. The cluster tool 800 is configured to form nitride compound structures for LED. Similar to the cluster tool 500 of FIG. 5, the cluster tool 800 comprises a transfer chamber 806, a load lock chamber 808 coupled to the transfer chamber, a load station 810 coupled to the load lock chamber 808, and a batch load lock chamber 809 coupled to the transfer chamber 606.

The cluster tool 800 comprises four processing chambers 801, 802, 803, 804 connected to the transfer chamber 806. In one embodiment, the processing chambers 801, 802, 803, 804 are configured to efficiently form different layers of a LED structure.

The processing chamber 801 is configured to clean substrates and form a buffer GaN layer on the substrates. In one embodiment, the processing chamber 801 is a HVPE chamber. In another embodiment, the processing chamber 801 may be a MOCVD chamber.

The processing chamber 802 is configured to an n-doped GaN layer for a LED structure. In one embodiment, the processing chamber 802 is a HVPE chamber configured to rapid formation of n-doped GaN. In another embodiment, the processing chamber 802 may be MOCVD chamber.

In one embodiment, the processing chamber 803 configured to deposit a MQW layer of a LED structure. In one embodiment, the processing chamber 803 may be a MOCVD chamber configured to form a MQW layer comprising InGaN.

In one embodiment, the processing chamber 804 is configured to deposit subsequent layers after a MQW layer of a LED structure. In one embodiment, the processing chamber 804 is a MOCVD chamber.

In one embodiment, the processing chamber (HVPE chamber) 802 may be similar to the HVPE chamber 200 of FIG. 2A. The processing chamber (HVPE chamber) 802 is adapted to perform HVPE processes in which gaseous metal halides are used to epitaxially grow thick layers of compound nitride semiconductor materials on heated substrates. The MOCVD chambers 803, 804 may be similar to the MOCVD chamber 100 of FIG. 3A.

In one embodiment, the processing chamber 801 is a HVPE chamber, and the processing chambers 802, 803, 804 are MOCVD chambers. In another embodiment, all four processing chambers 802, 803, 804 are MOCVD chambers.

Figure 9:
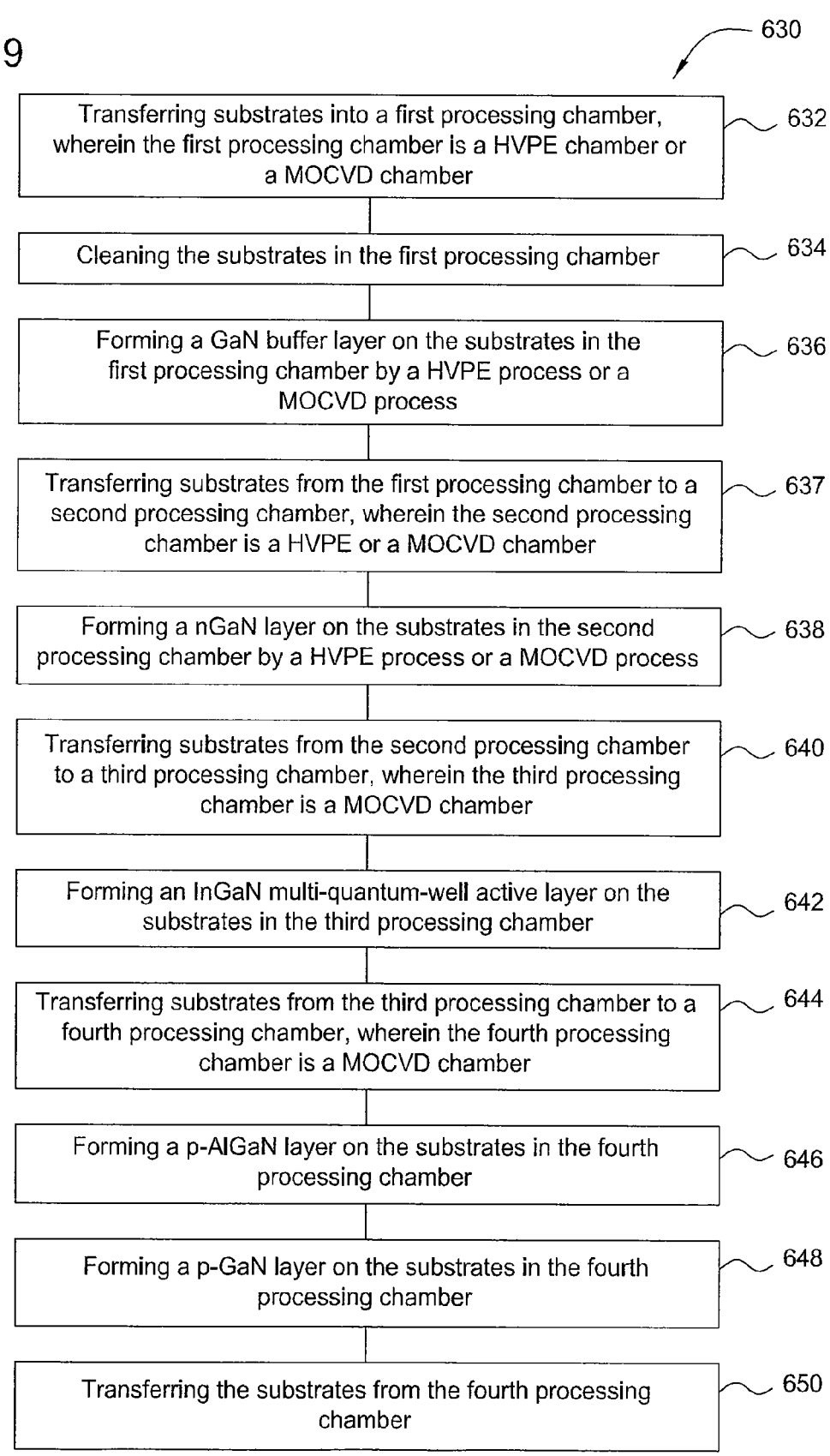
FIG. 9 is a flow chart of a processing sequence in accordance with one embodiment of the present invention.

FIG. 9 is a flow chart of a processing sequence 630 in accordance with one embodiment of the present invention. The processing sequence 630 describes a method for fabricating gallium nitride based LED structure using the cluster tool 800.

In block 632 of the processing sequence 630, a plurality of substrates are transferred to the processing chamber 801.

In block 634 of the processing sequence 630, the plurality of substrates are cleaned in the processing chamber 801.

In block 636 of the processing sequence 630, a GaN buffer layer is formed on the cleaned the substrate. The GaN buffer layer is formed from precursors of gallium and nitrogen by a HVPE process or a MOCVD process in the processing chamber 801.

In block 637 of the processing sequence 630, the plurality of substrates are transferred from the processing chamber 801 to the processing chamber (HVPE) chamber 802.

In block 638 of the processing sequence 630, an n-doped GaN layer is formed on the buffer layer by a HVPE process. In one embodiment, the processing chamber (HVPE chamber) 802 is configured to perform rapid deposition of the n-doped GaN layer.

In block 640 of the processing sequence 630, the plurality of substrates are transferred from the processing chamber (HVPE chamber) 802 to the processing chamber (MOCVD chamber) 803 via the transfer chamber 806.

In block 642 of the processing sequence 630, a multi-quantum-well (MQW) layer comprising Indium, gallium and nitrogen (InGaN) is formed on the substrates by a MOCVD process. The processing chamber (MOCVD chamber) 803 is adapted to provide highly uniform deposition, perhaps at the expense of overall deposition rate.

In block 644 of the processing sequence 630, the substrates are transferred from the processing chamber (MOCVD chamber) 803 to the processing chamber (MOCVD chamber) 804 via the transfer chamber 806.

In block 646 of the processing sequence 630, a p-doped AlGaN layer is formed on the substrates in the processing chamber (MOCVD chamber) 804.

In block 648 of the processing sequence 630, a p-doped GaN layer is formed on the substrates in the processing chamber (MOCVD chamber) 804.

In block 650 of the processing sequence 630, the substrates are transferred out of the processing chamber (MOCVD chamber) 804 and out of the cluster tool 800.

It should be noted that the processing sequence 630 is one example of fabricating a nitride compound structure using one processing chamber by a split batch process. The deposition of various layers can be grouped in any suitable way. Persons skilled in the art may arrange the split batch process according to process recipes and other factors.

While the foregoing is directed to embodiments of the present invention, other and further embodiments of the invention may be devised without departing from the basic scope thereof, and the scope thereof is determined by the claims that follow.

What is claimed is:

1. A method for fabricating a compound nitride structure, comprising:
   forming a group III nitride layer on each of two or more substrates disposed in a first processing chamber, wherein forming the group III nitride layer comprises:
      flowing a reactive gas comprising chlorine gas over a hydride vapor phase epitaxial (HVPE) precursor source to form a first reaction product comprising gallium chloride or aluminum chloride; and
      flowing the formed first reaction product to the two or more substrates disposed in the first processing chamber;
   transferring the two or more substrates from the first processing chamber to a second processing chamber in a first controlled environment;
   forming a ternary group III nitride layer over the group III nitride layer in the second processing chamber;
   transferring the two or more substrates from the second processing chamber to a third processing chamber in a second controlled environment; and
   forming a first doped group III nitride layer over the ternary group III nitride layer in the third processing chamber.

2. The method of claim 1, further comprising forming a second doped group III nitride layer on the first doped group III nitride layer.

3. The method of claim 2, wherein the second doped group III nitride layer is formed over the first doped group III nitride layer in the third processing chamber.

4. The method of claim 1, wherein the group III nitride layer formed on the two or more substrates in the first processing chamber comprises a third doped group III nitride layer.

5. The method of claim 1, wherein
the HVPE precursor source comprises gallium in liquid form or aluminum in solid, powder form.

6. A method for fabricating a compound nitride structure, comprising:
heating two or more substrates disposed in a first processing chamber while flowing a pretreatment gas mixture comprising ammonia and a halogen gas to the two or more substrates during a pretreatment process;
forming a group III nitride layer on each of the two or more substrates disposed in the first processing chamber, wherein forming the group III nitride layer comprises:
flowing a reactive gas comprising chlorine gas over a hydride vapor phase epitaxial (HVPE) precursor source to form a first reaction product comprising gallium chloride or aluminum chloride; and
flowing the formed first reaction product to the two or more substrates disposed in the first processing chamber;
transferring the two or more substrates from the first processing chamber to a second processing chamber in a first controlled environment;
forming a ternary group III nitride layer over the group III nitride layer in the second processing chamber;
transferring the two or more substrates from the second processing chamber to a third processing chamber in a second controlled environment;
forming a first doped group III nitride layer over the ternary group III nitride layer in the third processing chamber; and
forming a second doped group III nitride layer on the first doped group III nitride layer.

7. The method of claim 6, wherein the halogen gas comprises fluorine gas or chlorine gas.

8. The method of claim 6, wherein the group III nitride layer formed on the two or more substrates in the first processing chamber comprises an n-doped group III nitride layer.

9. The method of claim 6, wherein
the HVPE precursor source comprises gallium in liquid form or aluminum in solid, powder form.

10. A method for fabricating a compound nitride structure, comprising:
forming a gallium nitride layer on each of two or more substrates in a first processing chamber by a hydride vapor phase epitaxial (HVPE) process;
transferring the two or more substrates to a second processing chamber;
forming an InGaN layer on the gallium nitride layer within the second processing chamber by a first metal organic chemical vapor deposition (MOCVD) process;
transferring the two or more substrates to a third processing chamber;
forming a p-doped AlGaN layer on the InGaN layers within the third processing chamber by a second MOCVD process; and
forming a p-doped GaN layer on the p-doped AlGaN layer by a third MOCVD process.

11. The method of claim 10, wherein forming the InGaN layer comprises flowing two or more process gases through a gas distribution device into a process volume of the second processing chamber to deposit one or more films on the two or more substrates.

12. The method of claim 11, wherein forming the InGaN layer further comprises:
heating the two or more substrates using a heat source having an array of lamps arranged to form a plurality of concentric heat zones.

13. A method for fabricating a compound nitride semiconductor structure, comprising:
heating two or more substrates while flowing a gas mixture comprising ammonia and a carrier gas to the two or more substrates;
flowing a first gallium containing reaction product and a first nitrogen containing precursor to the two or more substrates disposed in a hydride vapor phase epitaxial (HVPE) chamber to form a gallium nitride layer thereon, wherein the first gallium containing reaction product is formed by:
flowing a reactive gas comprising chlorine over a HVPE precursor source, wherein the first gallium containing reaction product comprises gallium chloride;
removing the two or more substrates from the HVPE chamber and into a first controlled environment;
transferring the two or more substrates from the first controlled environment and into a first metal organic chemical vapor deposition (MOCVD) chamber;
flowing a first gallium containing precursor, an indium containing precursor, and a second nitrogen containing precursor into the first MOCVD processing chamber to form an InGaN layer over the gallium nitride layer;
removing the two or more substrates from the first MOCVD chamber and into a second controlled environment;
transferring the two or more substrates from the second controlled environment and into a second MOCVD chamber; and
flowing a second gallium containing precursor, an aluminum containing precursor, and a third nitrogen containing precursor into the second MOCVD processing chamber to form an AlGaN layer over the InGaN layer.

14. The method of claim 13, wherein forming the InGaN layer comprises flowing two or more process gases through a gas distribution device into a process volume of the second processing chamber to deposit one or more films on each of the two or more substrates.

15. The method of claim 14, wherein forming the InGaN layer further comprises:
heating the two or more substrates using a heat source having an array of lamps arranged to form a plurality of concentric heat zones.

16. A method for fabricating a compound nitride structure, comprising:
forming a group III nitride layer on each of two or more substrates disposed in a first processing chamber, wherein forming the group III nitride layer comprises:
flowing a reactive gas comprising chlorine gas over a hydride vapor phase epitaxial (HVPE) precursor source to form a first reaction product comprising gallium chloride or aluminum chloride; and
flowing the formed first reaction product to the two or more substrates disposed in the first processing chamber;
transferring the two or more substrates from the first processing chamber to a second processing chamber in a first controlled environment;
forming a ternary group III nitride layer over the group III nitride layer in the second processing chamber;
transferring the two or more substrates from the second processing chamber to a third processing chamber in a second controlled environment;
forming a first doped group III nitride layer over the ternary group III nitride layer in the third processing chamber;

transferring the two or more substrates from the third processing chamber to a fourth processing chamber in a third controlled environment; and forming a second doped group III nitride layer on the first doped group III nitride layer in the fourth processing chamber.

17. The method of claim 16, wherein the group III nitride layer formed on the two or more substrates in the first processing chamber comprises an n-doped group III nitride layer.

18. The method of claim 16, further comprising:

heating the two or more substrates while flowing a pretreatment gas mixture comprising ammonia and a halogen gas to the two or more substrates during a pretreatment process before forming the group III nitride layer on the two or more substrates.

19. The method of claim 16, wherein the HVPE precursor source comprises gallium in liquid form or aluminum in solid, powder form.

20. A method for fabricating a compound nitride structure, comprising:

forming a gallium nitride layer on each of the two or more substrates disposed in the first processing chamber, wherein forming the gallium nitride layer comprises:

flowing a reactive gas comprising chlorine gas over a hydride vapor phase epitaxial precursor source to form a first reaction product comprising gallium chloride; and flowing the formed first reaction product to the two or more substrates disposed in the first processing chamber;

forming a ternary group III nitride layer on two or more substrates disposed in a second processing chamber;

transferring the two or more substrates from the second processing chamber to a third processing chamber in a controlled environment;

forming a first doped group III nitride layer over the ternary group III nitride layer in the third processing chamber; and forming a second doped group III nitride layer on the first doped group III nitride layer.

21. The method of claim 20, wherein the second doped group III nitride layer is formed over the first doped group III nitride layer in the third processing chamber.

22. A method for fabricating a compound nitride structure, comprising:

heating two or more substrates while flowing a pretreatment gas mixture comprising ammonia and a halogen gas to the two or more substrates disposed in a first processing chamber during a pretreatment process;

forming a gallium nitride layer on each of the two or more substrates disposed in the first processing chamber, wherein forming the gallium nitride layer comprises:

flowing a reactive gas comprising chlorine gas over a hydride vapor phase epitaxial precursor source to form a first reaction product comprising gallium chloride; and flowing the formed first reaction product to the two or more substrates disposed in the first processing chamber;

transferring the two or more substrates from the first processing chamber to a second processing chamber in a first controlled environment;

forming a ternary group III nitride layer over the gallium nitride layer in the second processing chamber;

transferring the two or more substrates from the second processing chamber to a third processing chamber in a second controlled environment; and forming a first doped group III nitride layer over the ternary group III nitride layer in the third processing chamber.

23. The method of claim 22, wherein the first doped group III nitride layer comprises aluminum, gallium, and nitrogen.

* * * * *

UNITED STATES PATENT AND TRADEMARK OFFICE
CERTIFICATE OF CORRECTION

PATENT NO. : 8,183,132 B2
APPLICATION NO. : 12/751692
DATED : May 22, 2012
INVENTOR(S) : Nijhawan et al.

Page 1 of 1

It is certified that error appears in the above-identified patent and that said Letters Patent is hereby corrected as shown below:

In the Claims:

Column 26, Claim 13, Lines 1-2, please delete "semiconductor".

Signed and Sealed this
Twenty-eighth Day of August, 2012

David J. Kappos
*Director of the United States Patent and Trademark Office*